United States Patent
Tan et al.

(10) Patent No.: US 7,344,969 B2
(45) Date of Patent: Mar. 18, 2008

(54) STACKED DIE IN DIE BGA PACKAGE

(75) Inventors: Hock Chuan Tan, Singapore (SG);
Thiam Chye Lim, Singapore (SG);
Victor Cher Khng Tan, Singapore (SG); Chee Peng Neo, Singapore (SG);
Michael Kian Shing Tan, Singapore (SG); Beng Chye Chew, Singapore (SG); Cheng Poh Pour, Singapore (SG)

(73) Assignee: Micron Technology, Inc., Boise, ID (US)

( * ) Notice: Subject to any disclaimer, the term of this patent is extended or adjusted under 35 U.S.C. 154(b) by 122 days.

(21) Appl. No.: 10/424,470

(22) Filed: Apr. 28, 2003

(65) Prior Publication Data
US 2003/0207516 A1 Nov. 6, 2003

Related U.S. Application Data

(62) Division of application No. 10/068,159, filed on Feb. 5, 2002, now abandoned.

(30) Foreign Application Priority Data
Jan. 9, 2002 (SG) .......................... 200200134

(51) Int. Cl.
*H01L 23/48* (2006.01)

(52) U.S. Cl. .................... 438/612; 257/778; 438/108
(58) Field of Classification Search ............... 257/777, 257/778, 672, 676
See application file for complete search history.

(56) References Cited
U.S. PATENT DOCUMENTS 4,571,611 A  2/1986 Kashiwagi .................. 257/707

5,019,943 A  5/1991 Fassbender et al. ........ 361/744

(Continued)

FOREIGN PATENT DOCUMENTS

| | | |
|---|---|---|
| DE | 10209204 A1 | 10/2003 |
| EP | 1093165 | 4/2001 |
| JP | 62185348 | 8/1987 |
| JP | 02109410 | 4/1990 |
| JP | 6244360 | 9/1994 |
| JP | 11289023 | 10/1999 |
| JP | 2000049279 | 2/2000 |
| JP | 2000058742 | 2/2000 |
| JP | 2003282818 | 10/2003 |

OTHER PUBLICATIONS

IBM Research Disclosure RD41388 (N.N.), Sep. 1, 1998.

* cited by examiner

*Primary Examiner*—Thao P. Le
(74) *Attorney, Agent, or Firm*—Whyte Hirschboeck Dudek SC

(57) ABSTRACT

Semiconductor devices and stacked die assemblies, and methods of fabrication are provided. In various embodiments, the die assembly comprises a first die mounted on a substrate and a second die mounted on the first die. In one embodiment, the second die has a recessed edge along the perimeter of the bottom surface to provide clearance for a bonding element extending from bond pads on the first die to pads on the substrate, thus eliminating the need for a spacer between the two dies. In another embodiment, the second die is at least partially disposed within a recess in the upper surface of the first die. In another embodiment, an adhesive element is disposed within a recess in the bottom surface of the first die for attaching the first die to the substrate. In yet another embodiment, the first die is at least partially disposed within a recess within the bottom surface of the second die. The stacked die assemblies can be encapsulated to form semiconductor packages.

70 Claims, 14 Drawing Sheets

U.S. PATENT DOCUMENTS

| | | | |
|---|---|---|---|
| 5,323,060 A | 6/1994 | Fogal et al. | 257/777 |
| 5,760,478 A | 6/1998 | Bozso et al. | |
| 5,804,004 A * | 9/1998 | Tuckerman et al. | 156/60 |
| 5,886,412 A | 3/1999 | Fogal et al. | 257/777 |
| 5,904,497 A | 5/1999 | Akram | 438/106 |
| 5,910,686 A | 6/1999 | Hamzehdoost et al. | 257/778 |
| 5,952,725 A | 9/1999 | Ball | 257/777 |
| 5,985,695 A | 11/1999 | Freyman et al. | |
| 5,994,166 A | 11/1999 | Akram et al. | 438/108 |
| 6,005,778 A | 12/1999 | Spielberger et al. | |
| 6,020,629 A | 2/2000 | Farnworth et al. | 257/686 |
| 6,051,878 A | 4/2000 | Akram et al. | 257/686 |
| 6,051,886 A | 4/2000 | Fogal et al. | 257/777 |
| 6,052,287 A | 4/2000 | Palmer et al. | 361/767 |
| 6,080,264 A | 6/2000 | Ball | 156/292 |
| 6,081,997 A | 7/2000 | Chia et al. | |
| 6,084,308 A | 7/2000 | Jackson et al. | 257/777 |
| 6,165,815 A | 12/2000 | Ball | 438/113 |
| 6,207,474 B1 | 3/2001 | King et al. | 438/107 |
| 6,222,265 B1 | 4/2001 | Akram et al. | 257/723 |
| 6,239,484 B1 | 5/2001 | Dore et al. | |
| 6,262,488 B1 | 7/2001 | Masayuki et al. | |
| 6,271,056 B1 | 8/2001 | Farnworth et al. | 438/106 |
| 6,294,839 B1 * | 9/2001 | Mess et al. | 257/777 |
| 6,340,842 B1 | 1/2002 | Nakamura | |
| 6,351,028 B1 | 2/2002 | Akram | 257/686 |
| 6,380,615 B1 | 4/2002 | Park et al. | |
| 6,380,631 B2 * | 4/2002 | Mess et al. | 257/777 |
| 6,407,456 B1 | 6/2002 | Ball | |
| 6,472,758 B1 | 10/2002 | Glenn et al. | 257/777 |
| 6,476,475 B1 * | 11/2002 | Lee | 257/686 |
| 6,483,187 B1 | 11/2002 | Chao et al. | |
| 6,512,302 B2 * | 1/2003 | Mess et al. | 257/777 |
| 6,525,413 B1 | 2/2003 | Cloud et al. | |
| 6,531,784 B1 | 3/2003 | Shim et al. | 257/777 |
| 6,558,966 B2 * | 5/2003 | Mess et al. | 438/15 |
| 6,563,205 B1 * | 5/2003 | Fogal et al. | 257/686 |
| 6,706,557 B2 | 3/2004 | Koopmans | 438/109 |
| 6,730,543 B2 | 5/2004 | Akram | 438/109 |
| 6,731,009 B1 * | 5/2004 | Jones et al. | 257/777 |
| 6,737,750 B1 * | 5/2004 | Hoffman et al. | 257/777 |
| 6,777,797 B2 | 8/2004 | Egawa | 257/686 |
| 6,784,023 B2 * | 8/2004 | Ball | 438/113 |
| 6,818,998 B2 | 11/2004 | Kwon et al. | 257/777 |
| 6,833,287 B1 * | 12/2004 | Hur et al. | 438/107 |
| 6,861,760 B2 * | 3/2005 | Oka et al. | 257/777 |
| 6,906,408 B2 * | 6/2005 | Cloud et al. | 257/686 |
| 6,919,631 B1 * | 7/2005 | Hoffman et al. | 257/707 |
| 6,939,746 B2 * | 9/2005 | Bolken | 438/127 |
| 6,984,544 B2 * | 1/2006 | Cloud et al. | 438/107 |
| 2002/0096754 A1 | 7/2002 | Chen et al. | 257/686 |
| 2003/0111720 A1 | 6/2003 | Tan et al. | |

STACKED DIE IN DIE BGA PACKAGE

CROSS-REFERENCE TO RELATED APPLICATIONS

This application is a division of U.S. patent application Ser. No. 10/068,159, filed Feb. 5, 2002 now abandoned.

FIELD OF THE INVENTION

This invention generally relates to assembling and packaging multiple semiconductor dies, and more particularly to a stacked multiple die device and methods for fabricating the device.

BACKGROUND OF THE INVENTION

Miniaturization of wireless products such as cellular phones and handheld computers such as personal digital assistants (PDA), has driven the increased demand for smaller component footprints, which in turn increases the popularity of multi-chip stack BGA packaging. Most multi-chip packages involve stacking dies on top of each other by means of adhesive elements. However, to achieve a low package height for multi-chip stacked die packages, a significantly reduced die thickness is needed together with the use of special wire bond techniques to reduce the height of the wire bond loop height.

Thin die handling and the required special bonding techniques poses many challenges to the assembly process. FIGS. 1–3 depict conventional ways of packaging a multi-chip stacked die package. As shown in FIG. 1, one prior art package 10 includes two conventional stacked dies, the first (bottom) die 12 being surface mounted by means of an adhesive element 14 to a substrate 16, and a smaller second (top) die 18 being mounted by a second adhesive element 20 onto the active surface 22 of the bottom die 12, each of the dies being wire bonded 24 to the substrate 16. FIG. 2 illustrates a prior art stack die package 10a in which the first (bottom) die 12a is mounted to a substrate 16a in a flip chip attachment, and the second (top) die 18a is surface mounted to the inactive surface of the first die 12a by means of an adhesive element 20a and wire bonded 24a to the substrate 16a. FIG. 3 shows a prior art three-die stack BGA package 10b in which the first bottom die 12b is mounted to a substrate 16b by an adhesive element 14b, a second (middle) die 18b is mounted on the active surface 22b of the bottom die 12b by a second adhesive element 20b, and a third (top) die 28b is mounted on a spacer 30b mounted on the active surface 32b of the second (middle) die 18b, with each of the dies being wire bonded 24b to the substrate 16b.

In stacked die assemblies in which the bottom die is a flip chip, there is a limit on the minimum overall thickness of the package that can be achieved. If a solder-bumped wafer having a 150 μm bump height were to be ground to a total thickness of 150 μm to 200 μm, there would be a high occurrence of broken wafers due to the stress induced on the wafers from the bumps. Furthermore, even if the wafer does not crack, the die strength will drop significantly due to the presence of "dimples" on the backside of the wafer. Such dimples are typical defects observed on bump wafers that are ground too thin or an inappropriate backgrinding tape is used in the process.

In addition, as depicted in FIG. 3, with multiple stacked dies, a spacer 30c is required to create the minimal clearance for the wire loop height between the second (middle) die 18b and the third (top) die 28b. This results in a higher package height, or requires ultrathin dies in order to meet the package height requirement. Thinner dies translate into a higher possibility of cracked dies during the assembly process.

In view of these and other deficiencies, improvements in stacked die modules are desirable.

SUMMARY OF THE INVENTION

The present invention provides semiconductor devices and stacked die assemblies, methods of fabricating the devices and assemblies for increasing semiconductor device density, and method of fabricating die packages of the assemblies.

In one aspect, the invention provides a stacked die assembly. In one embodiment, the stacked die assembly, comprises a first (bottom) die disposed on a substrate, a bonding element connecting bond pads on an active surface of the bottom die to terminal pads on the substrate, and a second die mounted on the bottom die. The second die has a bottom surface with a recessed edge along the perimeter of the die that provides an opening for the bonding element extending from the bond pads of the bottom die, thus eliminating the need for a spacer between the two dies to achieve sufficient clearance for the bonding element. A second bonding element connects the bond pads on the active surface of the second die to terminal pads on the substrate. Adhesive elements are typically disposed between the two dies and the bottom die and the substrate.

In another embodiment, the stacked die assembly, comprises a first (bottom) die disposed on a substrate, typically through a flip chip attachment, and having a recess formed in the upper (inactive) surface. A second die is at least partially disposed within the recess of the first die. A bonding element connects bond pads on the active surface of the second die to terminal pads on the substrate. An adhesive element can be disposed within the recess to attach the two dies. In a further embodiment of this assembly, a third die is mounted on the second die. The third die has a bottom surface with a recessed edge along the perimeter of the die that provides an opening for the bonding element extending from the bond pads of the second die, thus eliminating the need for a spacer between the two dies for clearance of the bonding element. A second bonding element connects the bond pads on the active surface of the third die to terminal pads on the substrate. An adhesive element can be used to attach the second and third dies.

In a further embodiment, the stacked die assembly, comprises a first (bottom) die disposed on a substrate, a bonding element connecting bond pads on the active surface of the first die to terminal pads on the substrate, and a second die mounted on the bottom die. A recess is formed on the bottom surface of the first die, and an adhesive element is disposed within the recess to attach to the first die to the substrate. The containment of the adhesive element in the recess rather than being disposed between the die and the substrate as a separate layer decreases the overall height of the die assembly. In an embodiment of this assembly, the second die has a recessed edge along the perimeter of the bottom surface for clearance of the bonding element extending from the bond pads of the second die, thus eliminating the need for a spacer between the two dies. Bond pads on the second die are connected to terminal pads on the substrate by a second bonding element, and an adhesive element can be used to attach the second and third dies.

In yet another embodiment, the stacked die assembly, comprises a first (bottom) die disposed on a substrate, typically through a flip chip attachment, and a second die having a recess formed in the bottom (inactive) surface. The first die is at least partially disposed in the recess of the second die, and a bonding element connects bonding pads on the second die. An adhesive element can be disposed within the recess to attach the two dies.

In another aspect, the invention provides a semiconductor package. In various embodiments, the package comprises a stacked die assembly according to the invention, at least partially encapsulated. The package can further include external contacts disposed on the second surface of the substrate for attaching the package as a component to an external electrical apparatus or device.

In another aspect, the invention provides methods of fabricating the foregoing stacked die assemblies and semiconductor packages.

BRIEF DESCRIPTION OF THE DRAWINGS

Preferred embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

FIG. 6 is a bottom, perspective view of the second die of the package of FIG. 4, showing the removed (etched) portion of the die forming the recessed edge along the perimeter of the die. FIGS. 7 and 9–11 are cross-sectional, side elevational views of sequential steps in the mounting of the dies. FIG. 8 is a top plan view of a panel with multiple die packages disposed thereon.

FIG. 14 is a top, perspective view of the first (bottom) die of the package of FIG. 12, showing the recess formed in the die. FIGS. 13 and 15–16 are cross-sectional, side elevational views of sequential steps in the mounting of the dies.

FIG. 22 is a bottom, perspective view of the first (bottom) die of the package of FIG. 20, showing the recess formed in the bottom surface of the die. FIGS. 21 and 23–24 are cross-sectional, side elevational views of sequential steps in the mounting of the dies.

FIG. 26 is a bottom, perspective view of the second (top) die of the package of FIG. 25, showing the recess formed in the bottom surface of the die. FIGS. 27–29 are cross-sectional, side elevational views of sequential steps in the mounting of the dies.

DETAILED DESCRIPTION OF THE PREFERRED EMBODIMENTS

The invention will be described generally with reference to the drawings for the purpose of illustrating embodiments only and not for purposes of limiting the same. The figures illustrate processing steps for use in fabricating semiconductor devices in accordance with the present invention. It should be readily apparent that the processing steps are only a portion of the entire fabrication process.

The terms "top" and "bottom", and "upper" and "lower" are used herein for convenience and illustrative purposes only, and are not meant to limit the description of the invention inasmuch as the referenced item can be exchanged in position.

The invention advantageously reduces the overall height of stacked die packages, achieves a desirably low package profile, allows the use of thicker dies in the stack assembly to reduce the number of cracked dies, eliminate the need for a spacer between dies to provide clearance for bond wires extending from an underlying die, and reduces the number of passes required for manufacturing multiple stacked dies by eliminating the need for mounting a spacer. The invention further offers more reliable adhesion bleed out control, and the benefits increase as more dies are stacked. The method of the invention can be utilized to fabricate an assembly comprising additional stacked die layers to those of the illustrated embodiments using the described concepts herein.

In each of the described embodiments, prior to mounting the individual dies of a stacked assembly, the backside (inactive surface) of a die (wafer) can be backgrinded or otherwise processed to a desired thickness, flatness value and texture using conventional methods in the art.

Figure 3:
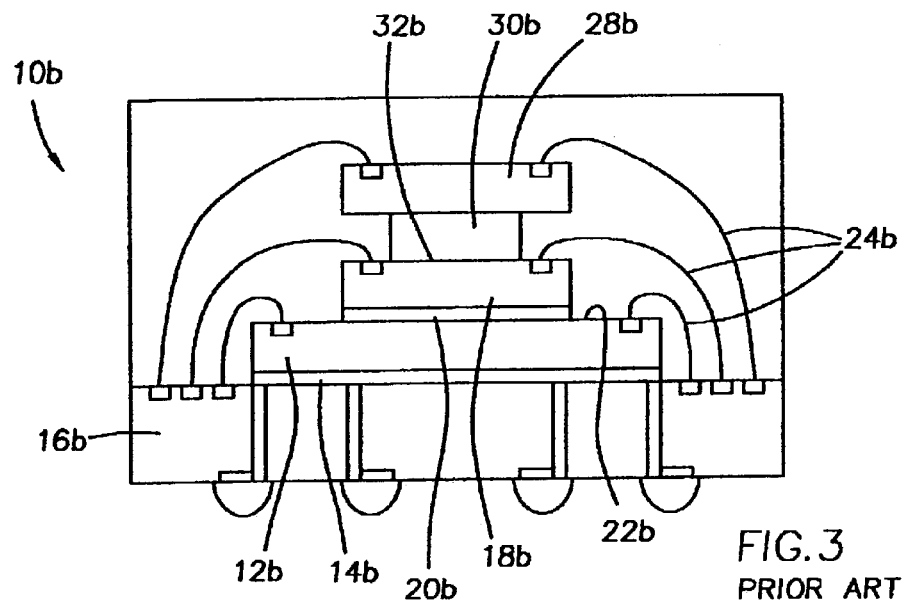
Figure 4:
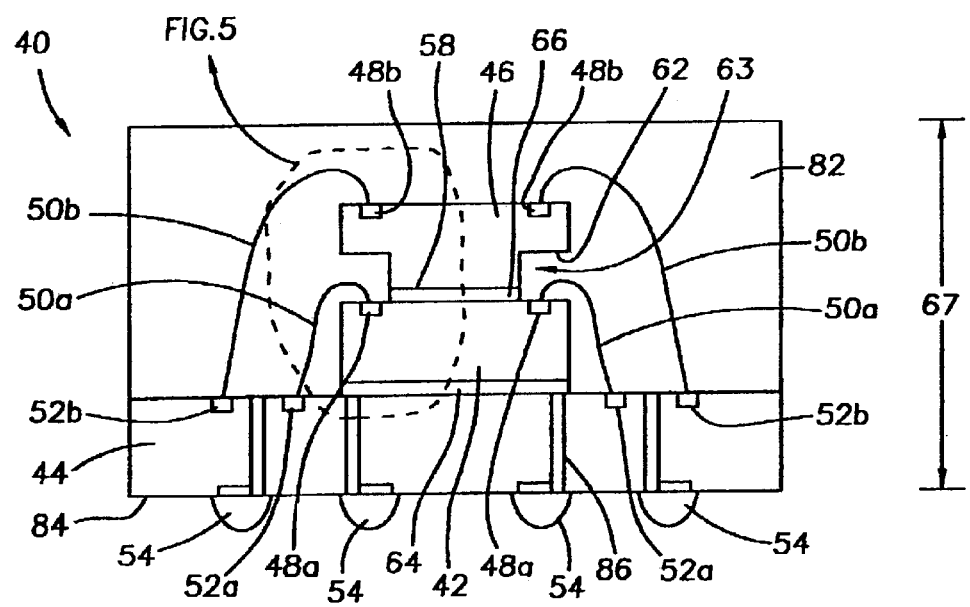
FIG. 4 is a cross-sectional, side elevational view of an embodiment of a stacked die package according to the invention.
Figure 5:
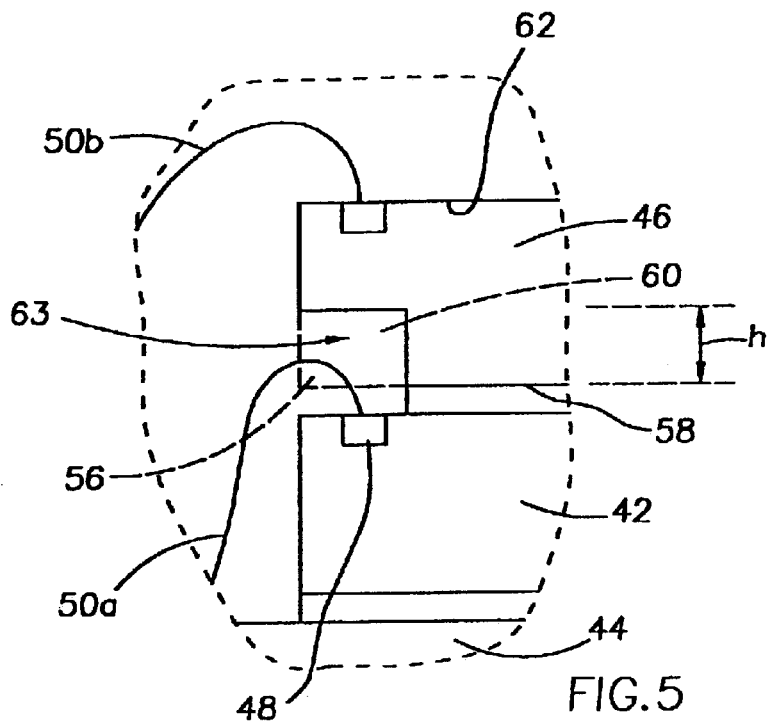
FIG. 5 is an enlarged partial view of the package of FIG. 4, showing the recessed edge and opening between the stacked dies.

Referring to FIG. 4, a first embodiment of a multiple chip die assembly package 40 according to the invention is depicted in a cross-sectional, side elevational view. The package 40 comprises a first (bottom) die 42 mounted to a support substrate 44, and a second (top) die 46 mounted on the bottom die 42. Bond pads 48a, 48b on the first and second dies 42, 44 are wire bonded 50a, 50b, respectively, to terminal pads 52a, 52b on the support substrate 44. Substrate 44 further includes external contacts 54, for example, in the form of conductive solder balls, to connect the die package 40 to an external electrical apparatus (not shown). As best seen in FIG. 5, a portion or thickness 60 (shown in phantom) along the perimeter 56 of the second (inactive) surface 58 of the second (top) die 46 is removed (e.g, etched) to provide a recess (recessed edge) 62. The recessed edge 62 has a height (h) and provides an opening 63 for sufficient clearance of the bond wires 50a (or other connecting member such as TAB tape) extending from the bond pads 48a on the bottom die 42 to the substrate 44. This eliminates the need for a spacer (e.g., FIG. 3, 30b) between the two overlying dies to provide the necessary clearance for bond wires extending from the lower die 42, and thus achieves a lower overall package height 67. Adhesive elements 64, 66 can be utilized, respectively, to secure the bottom die 42 onto the support substrate 44, and the second (top) die 46 onto the bottom die 42.

FIGS. 6–11 illustrate an embodiment of a process flow and method for forming the stacked die package 40 of FIG. 4.

Figure 6:
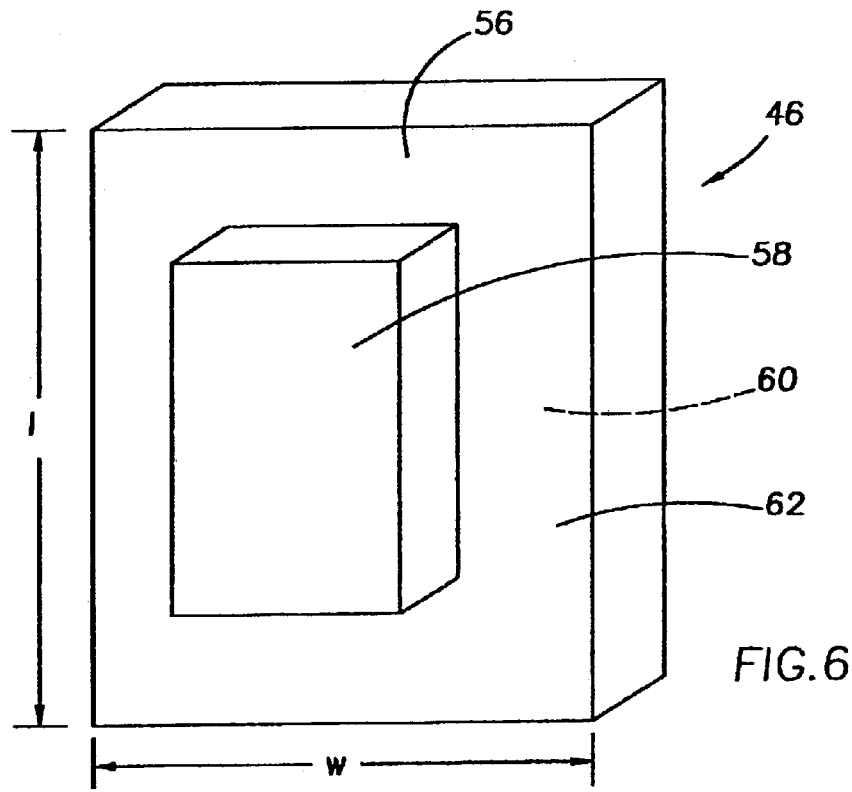
FIGS. 6–11 illustrate sequential processing steps in the fabrication of the stacked die package of FIG. 4, according to an embodiment of a method of invention.

Prior to mounting, a portion or thickness of the second (inactive) surface 58 of the second (top) die 46 can be removed to form the recessed edge 62. As shown in FIGS. 5–6, a portion 60 (shown in phantom in FIG. 5) of the surface 58 has been removed along the perimeter 56 of the die. Known methods in the art can be used to selectively remove a portion 60 along the perimeter of the die 46 such that when the die 46 is subsequently mounted onto the first (bottom) die 42, the recessed edge 62 provides an opening with sufficient clearance for the bond wires 50a extending from the bottom die 42 to the support substrate 44. The recessed edge 62 can be formed using known techniques in the art, for example, a chemical wet etch or dry etch, laser ablation, or other mechanical means of reducing the bottom surface 58 of the top die 46 to a predetermined depth.

Figure 7:
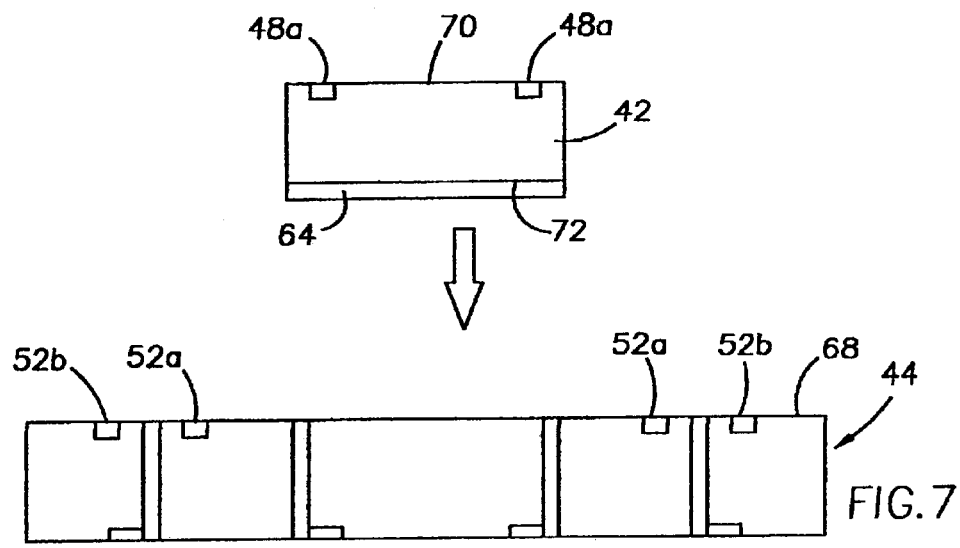
Figure 8:
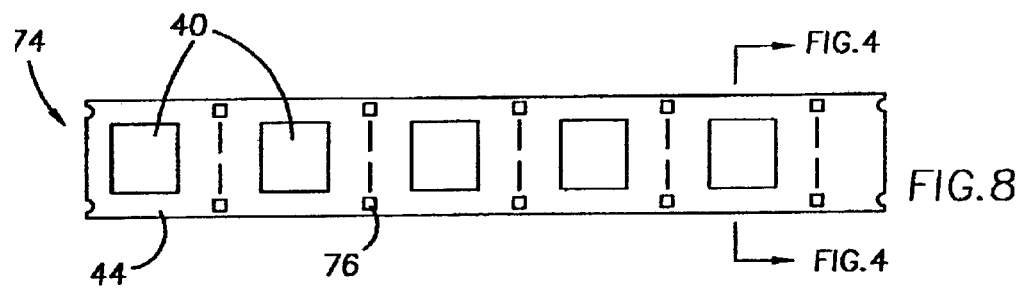
Figure 9:
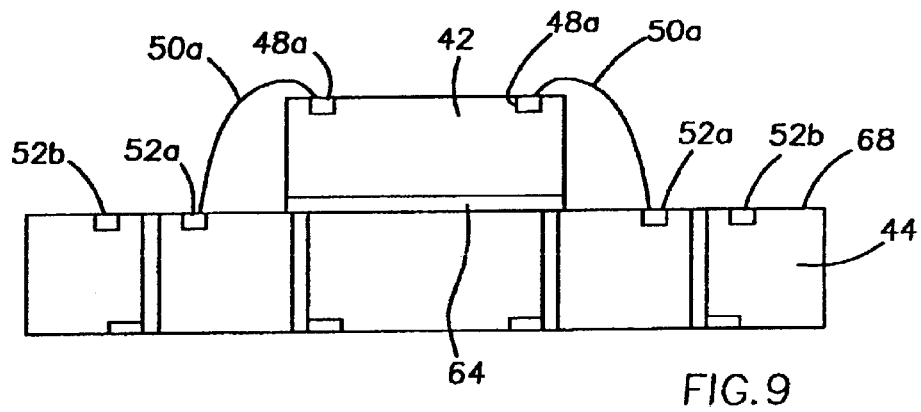

Referring now to FIGS. 7–9, the first (bottom) die 42 is mounted on a first surface 68 of the support substrate 44. The bottom die 42 comprises a first (active) surface 70 with a plurality of bond pads 48a along the periphery thereof, and a second (bottom) surface 72. As shown in FIG. 7, the bottom surface 72 of the bottom die 42 is aligned with and facing the first surface 68 of the support substrate 44 prior to assembly.

The support substrate 44 can comprise an electrically insulating polymer material such as a resin reinforced with glass fibers, for example, bismaleimide triazine (BT) resin, epoxy resins such as FR-4 or FR-5 laminates, ceramics, and polyimide resins; a metal leadframe (e.g., Alloy42 or copper); a flexible polyimide film (e.g., KAPTON from DuPont, Wilmington, Del., or UPILEX from Ube Industries, Ltd., Japan); among other substrates. A representative thickness of the substrate is about 50 µm to about 500 µm. As shown in FIG. 8, the support substrate 44 can be in the form of a strip or panel 74 on which multiple die packages 40 are formed, whereby the panel 74 can be singulated, for example, by cutting or shearing along an expansion slot 76, into individual packages.

Referring to FIG. 7, the bottom die 42 can be attached to the support substrate 44 by use of an adhesive element 64. The adhesive element 64 can be applied onto the bottom surface 72 of the bottom die 42 (as shown), and/or to the first surface 68 of the support substrate 44. The adhesive element 64 can comprise any suitable adhesive material known in the art, including contact adhesives, thermoplastic adhesives and thermosetting adhesives, for example, a die-attach epoxy or equivalent, or a double-sided, multi-layered adhesive tape such as polyimide film coated on both sides with adhesive. The bottom die 42 and/or the support substrate 44 can be provided in a pre-taped form with an adhesive tape attached thereto, or an adhesive element 64 can be applied to either or both of the bottom die 42 and the support substrate 44 during fabrication of a stacked die package. Many suitable adhesive application methods for liquid or gel adhesive application are known in the art, such as screen printing, roller applicator, spray, and transfer. Similarly, an adhesive tape may be applied from a dispenser and severed from a roll of tape, or applied from a transfer (carrier) film.

Referring to FIG. 9, with the first (bottom) die 42 mounted on the substrate 44, the bond pads 48a of the first (bottom) die 42 are then electrically connected to the terminal pads 52a on the support substrate 44, for example, by wire bonding (as shown) or by tape automated bonding ("TAB"). For example, ball bonds (not shown) can be thermosonically bonded to the bond pads 48a, and the bond wires 50a extended and bonded to the terminal pads 52a on the support substrate 44. In other embodiments, TAB bonding and ultrasonic bonding, as known in the art, can be used to connect the bond pads 48 and the terminal pads 52.

Figure 10:
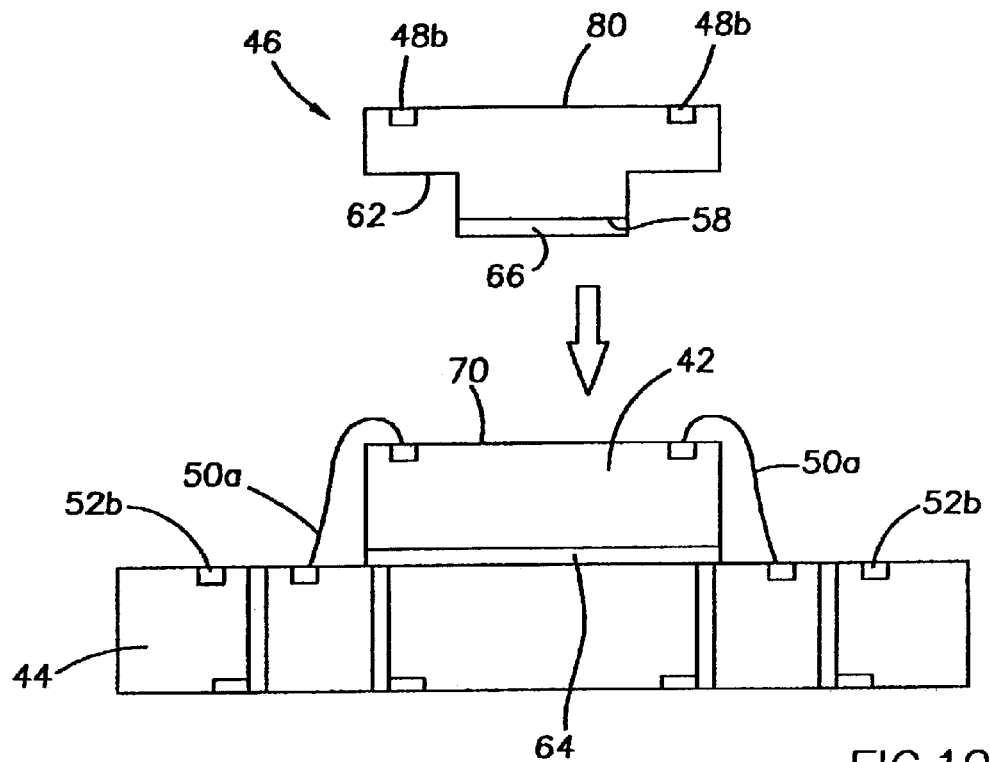
Figure 11:
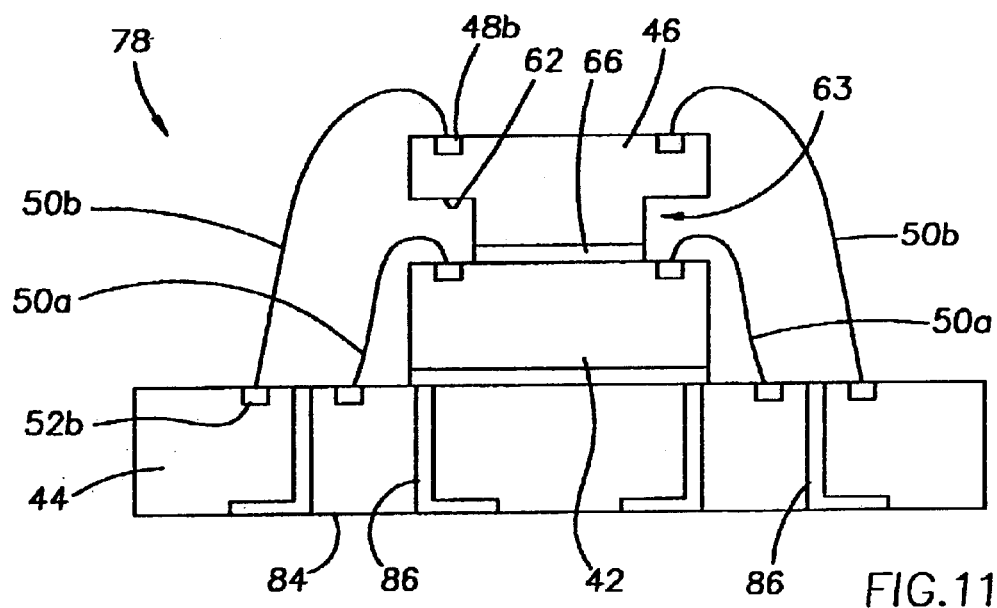

Referring to FIGS. 10–11, the second (top) die 46 is then mounted onto the first (active) surface 70 of the first (bottom) die 42 to form the stacked die assembly 78. The second die 46 comprises a first (active) surface 80 with a plurality of bond pads 48b along the periphery thereof, and a second (inactive) surface 58. As shown in FIG. 10, the second surface 58 of the second (top) die 46 is aligned with and facing the first surface 70 of the first (bottom) die 42 prior to assembly. The recessed edge 62 between the first (bottom) die 42 and the overlying second die 46 is sized with a height (h) to provide an opening 63 for sufficient clearance of the bond wires 50a extending from the bottom die 42 to the support substrate 44.

The second (top) die 46 can be attached to the bottom die 42 by means of an adhesive element 66, for example, a tape or die-attach adhesive as described with reference to adhesive element 64. The first (bottom) die 42 and/or the second (top) die 46 can be provided in a pre-taped form with an adhesive tape attached thereto, or an adhesive element 66 can be applied to either or both dies during mounting of the second (top) die onto the first (bottom) die.

As shown in FIG. 11, the bond pads 48b of the second (top) die 46 are then electrically connected to the terminal pads 52b on the support substrate 44, for example, by wire bonding, as shown in the illustrated example, or by TAB bonding, resulting in the wire-bonded stacked die assembly 78.

The die assembly 78 can be partially or fully encapsulated with a dielectric encapsulation material 82, typically a thermoset resin, the assembly 78 can be encapsulated using known techniques in the art, for example, screen printing, glob-top, pot molding, and transfer molding, resulting in the encapsulated stacked die package 40 depicted in FIG. 4. In one embodiment, a number of die assemblies 78 can be placed in a lower mold plate or half of an open multi-cavity mold, one assembly within each cavity, and following encapsulation, the mold plates are separated and the individual packages 40 can be singulated.

In the embodiment illustrated in FIG. 4, external contacts 54, typically in the form of conductive solder balls (or other suitable conductive material such as conductive epoxies or conductor-filled epoxies), columns, pins, and the like, are mounted on the second (bottom) surface 84 of the support substrate 44 for electrical connection of the encased die package 40 as a component to an external electrical apparatus (not shown). Examples of such electric apparatus include a PCB or other external circuitry (not shown) such as a motherboard of a computer, program logic controller (PLC), a testing apparatus, among others. The support substrate 44 typically includes a variety of conductive through-holes or vias 86 that extend through the cross-section of the substrate and establish routing of the conductive elements through the substrate 44, and further include electrically conductive metal lines or traces and pads formed on the second (bottom) surface 84 on which the external contacts 54 are mounted.

Where multiple die packages are fabricated on a panel substrate (e.g. panel 74, FIG. 8), the panel can be singulated into individual die packages 40, for example, by cutting or shearing.

Figure 12:
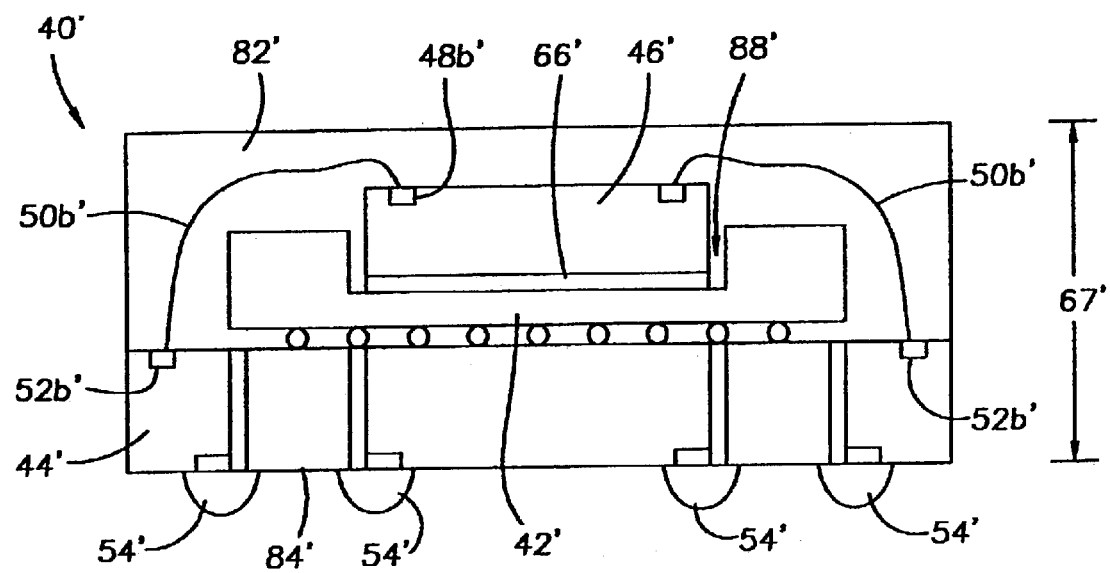
FIG. 12 is a cross-sectional, side elevational view of another embodiment of a stacked die package according to the invention.

Another embodiment of a multiple chip die assembly package according to the invention is depicted in a cross-sectional, side elevational view in FIG. 12. The package 40' comprises a first (bottom) die 42' mounted to a support substrate 44' in a flip chip attachment, and a second (top) die 46' mounted in a recess 88' formed in the first (upper) surface 72' of the bottom die 42'. Bond pads 48*b*' on the second (top) die 46' are wire bonded to terminal pads 52*b*' on the support substrate 44'. The substrate further includes external contacts 54' (e.g. solder balls) for connection of the die package 40' as a component to an external electrical apparatus (not shown). The recess 88' in the bottom die 42' allows the second (top) die 46' to be inset into the bottom die 42', thus achieving a lower overall package height 67'. An adhesive element 66' can be utilized to attach the second (top) die 46' onto the bottom die 42'.

FIGS. 13–16 illustrate an embodiment of a process flow and method for forming the stacked die package 40' of FIG. 12.

Figure 13:
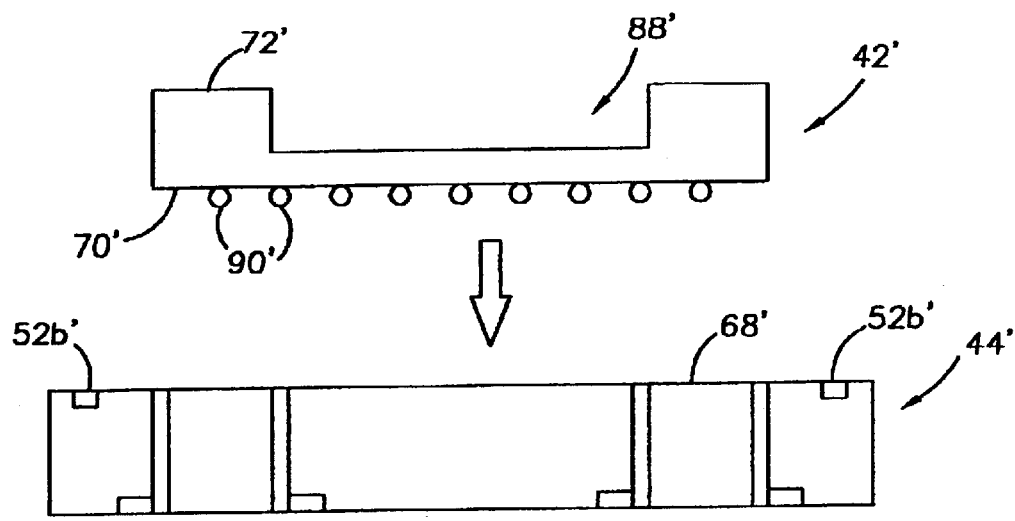
FIGS. 13–16 illustrate sequential processing steps in the fabrication of the stacked die package of FIG. 12, according to an embodiment of a method of invention.
Figure 15:
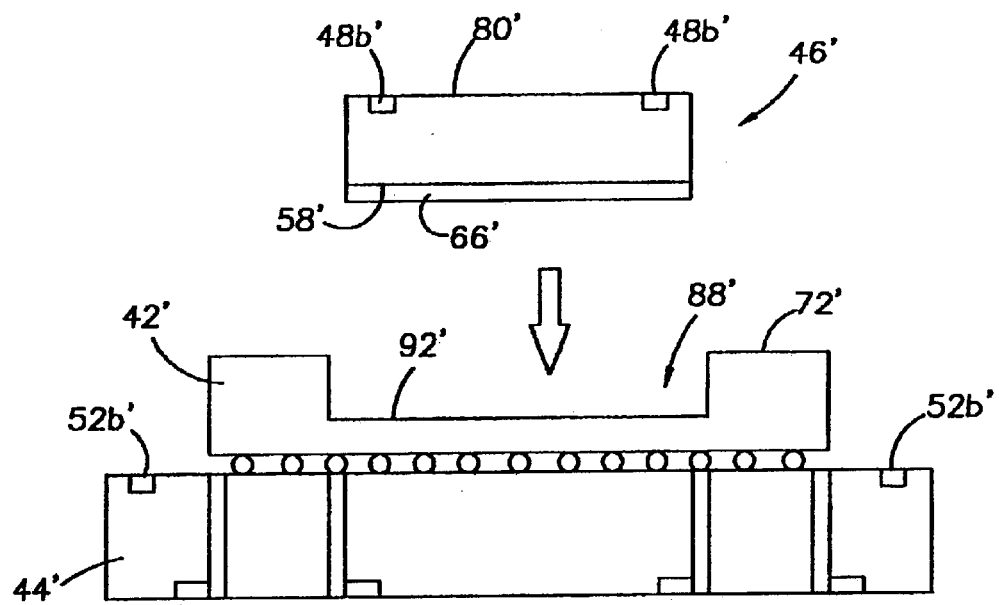

FIGS. 13 and 15 depict simplified cross-sectional views of the mounting and bonding of the first (bottom) die 42' in a flip chip attachment to the substrate 44'. As shown, the first die 42' comprises a first (active) surface 70' and a second (inactive) surface 72'. The active surface 70' of the first die 42' includes a plurality of bond pads with conductive bumps 90' mounted thereon, which are arranged in a predetermined configuration. The conductive bumps 90' typically comprise a metal or alloy such as copper, silver or gold, or a conductive polymer material, and can be formed by known methods in the art, for example, electroplating, metal stud bumping by wire bonders, and stenciling. The support substrate 44' can be in a form as described, for example, with respect to the support substrate 44 (die package 40) (FIGS. 6–11).

Figure 14:
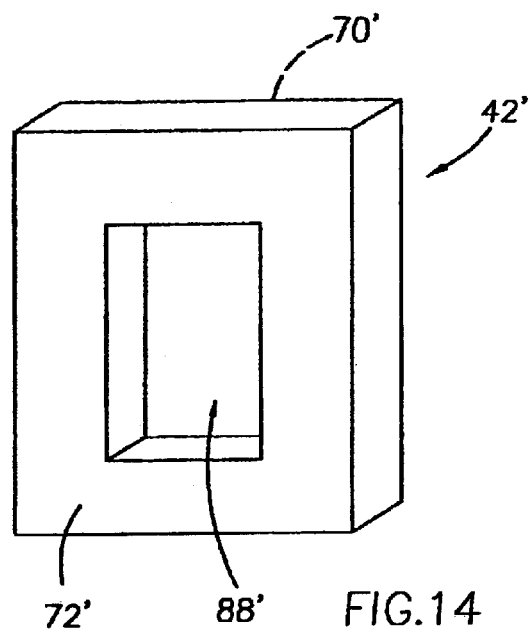

Prior to mounting, a recess 88' can be formed in the second (inactive) surface 72' of the first (bottom) die 42', as shown in cross-section in FIG. 13, and in a top perspective view in FIG. 14. The recess 88' is sized and configured to receive the second die 46' therein in a subsequent step. The recess 88' can be formed in any suitable shape, such as square, rectangular, oval, and circular. The recess 88' can be formed to a predetermined depth and width to accommodate the placement of the second die therein using known methods in the art, for example, patterning and utilizing a chemical wet etch or dry etch, laser ablation, or other mechanical means of removing the second (inactive) surface 72' of the die. Dry etchers are commercially available, for example, from SECON, having an etch rate of 25 μm/min. for an 8-inch wafer. The recess can be formed at the wafer level, the die level (i.e., singulated die), or on a strip level after the die 42' is mounted on the substrate (e.g., strip).

The bottom die 42' can be mounted on the support substrate 44' by conventional flip chip methodology. As shown in FIG. 13, the active surface 70' of the bottom die 42' is aligned with and facing the first (upper) surface 68' of the support substrate 44' prior to assembly. Traces and electrical connections (not shown) on the first surface 68' of the support substrate 44' are configured to correspond to the configuration of bond pads and the conductive bumps 90' of the bottom die 42'. The conductive bumps 90' in the form of solder bumps can be reflowed to physically and electrically bond with the traces or other conductive elements on the first (upper) surface 68' of the support substrate 44', or cured in the case of conductive polymer bumps, although other methods such as thermal compression can also be used. Terminal pads 52*b*' on the first surface 68' of the support substrate 44' are exposed along the periphery.

Figure 16:
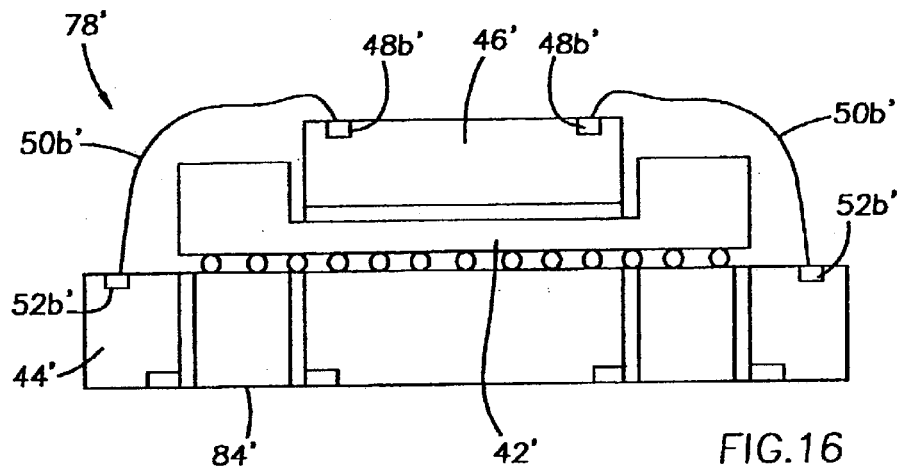

Referring to FIGS. 15–16, the second (top) die 46' is then mounted in the recess 88' of the bottom die 42'. The second (top) die 46' comprises a first (active) surface 80' with a plurality of bond pads 48*b*' along the periphery thereof, and a second (bottom) surface 58'. As shown in FIG. 15, the second (bottom) surface 58' of the second (top) die 46' is aligned with and facing the recess 88' in the second surface 72' of the bottom die 42' prior to assembly.

The second (top) die 46' can be attached to the bottom die 42' by means of an adhesive element 66'. The adhesive element 66' can be applied within the recess 88' to the recess surface 92' of the bottom die 42', and/or to the second surface 58' of the top die 46' (as shown). The adhesive element 66' can comprise any suitable adhesive material known in the art, for example, a tape adhesive or die attach adhesive, as described with respect to adhesive element 64'. The adhesive element 66' can have a thickness such that it functions as a spacer to control the degree of insertion of the second die 46' into the recess 88'. The first and/or second dies 42', 46' can be provided in a pre-taped form with an adhesive tape attached thereto, or an adhesive element 66' can be applied to either or both dies during fabrication of the stacked die package 40'. The adhesive element 66' can be applied by conventional methods known in the art.

As depicted in FIG. 16, the bond pads 48*b*' of the second (top) die 46' are then electrically connected to the terminal pads 52*b*' on the support substrate 44', for example, by wire bonding (as shown) or by TAB bonding.

The wire bonded stacked die assembly 78' can then be partially or fully encapsulated with a dielectric encapsulation material 82' using known methods in the art to form the encapsulated stacked die package 40' shown in FIG. 12.

External contacts 54' (e.g., conductive solder balls can then be mounted on the second (bottom) surface 84' of the support substrate 44' for connecting the die package 40' to a motherboard or other electrical apparatus (not shown).

Where applicable, a panel substrate comprising a plurality of dies (e.g., FIG. 8, panel 74) can then be singulated into individual die packages 40'.

Figure 17:
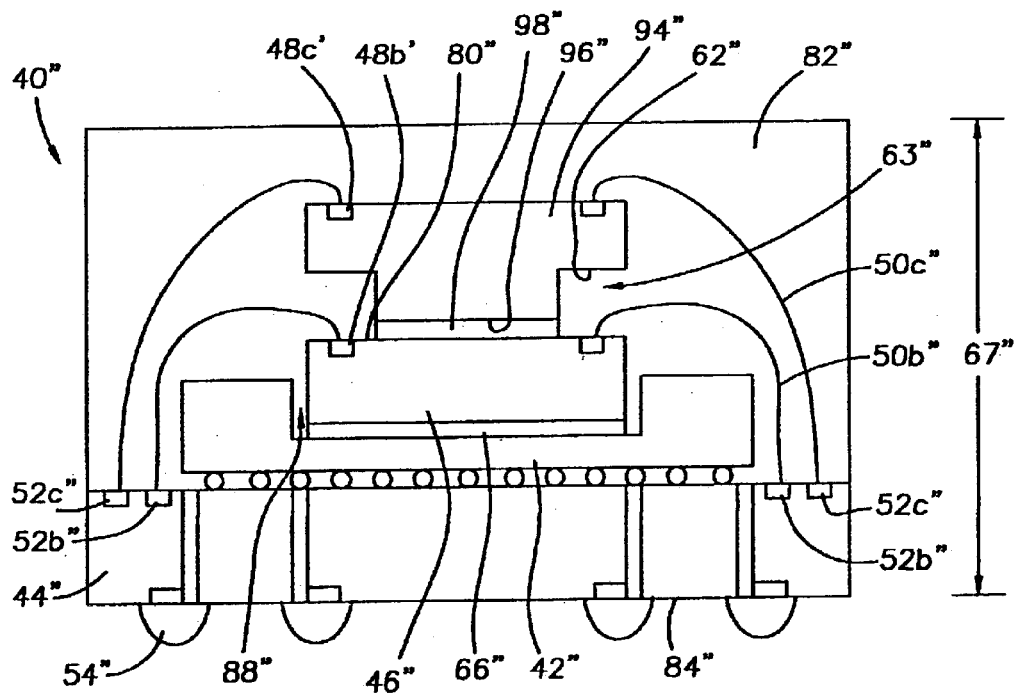
FIG. 17 is a cross-sectional, side elevational view of another embodiment of a stacked die package according to the invention.

A further embodiment of a multiple chip die assembly package according to the invention is depicted in a cross-sectional, side elevational view in FIG. 17. The die package 40" incorporates features of the die packages 40, 40' depicted in FIGS. 4 and 12.

As illustrated, the package 40" comprises a first (bottom) die 42" mounted onto a support substrate 44" in a flip chip attachment, and a second (middle) die 46" at least partially received within a recess 88" in the bottom die 42", similar to the die package 40' (FIG. 12). The package 40" further comprises a third (top) die 94" mounted on the first (active) surface 80" of the second (middle) die 46", similar to the die package 40 (FIG. 4). Bond pads 48*b*", 48*c*" on the second (middle) die 46" and the third (top) die 94" are wire bonded to terminal pads 52*b*", 52*c*", respectively, on the support substrate 44". Substrate 44" further includes external contacts 54" (e.g., solder balls) for connecting the die package 40" as a component to an electrical apparatus (not shown).

A portion along the perimeter of the second (inactive) surface 96" of the third (top) die 94" is partially removed to provide a recessed edge 62" to provide an opening 63" for sufficient clearance of the bond wires 50b" connecting the bond pads 48b" on the second (middle) die 46" to the substrate 44", thus eliminating the need for a spacer between the two dies 46", 94". The recess 88" in the bottom die 42" allows the second (middle) die 46" to be inserted (nested) therein. The recess features 62", 88" advantageously combine to achieve a lower overall package height 67" Adhesive members 66", 98" can be utilized, respectively, to attach the second (middle) die 46" to the bottom die 42", and the third (top) die 94" to the second (middle) die 46".

The stacked die package 40" of FIG. 17 can be fabricated utilizing the process steps described above in fabricating packages 40, 40'.

Prior to mounting, the recesses 88", 62" can be formed in the first (bottom) die 42" and the third (top) die 94", respectively.

A recess 88" can be formed in the second (inactive) surface 72" of the bottom die 42", as described with respect to die 42' (package 40) and as depicted in FIGS. 13–14. The recess 88" is sized and configured to receive the second (middle) die 46" therein in a subsequent step, and can be suitably shaped to correspond with the shape of the second die.

A recessed edge 62" along the perimeter 56" of the second (inactive) surface 58" of the third (top) die 94" can be formed as described previously for the second die 46 of package 40 and as depicted in FIGS. 4–6. A portion 60" of the third (top) die 94" is removed along the second (bottom) surface 58" to provide a recessed edge 62".

Similar to the mounting of the first die 42' on the substrate 44' shown in FIGS. 13 and 15, the first (bottom) die 42" is mounted on a support substrate 44" using flip chip technology, with the terminal pads 52a", 52b" on the surface of the support substrate 44" exposed along the periphery.

The second (middle) die 46" is then mounted in the recess 88" of the bottom die 42", as depicted in FIGS. 15–16. The second die 46" comprises a plurality of bond pads 48b" on a first (active) surface 80", and a second (bottom) surface 58". The bottom surface 58" of the second die 46" is mounted onto the recess surface 92" of the bottom die 42" by means of an adhesive element 66", such as a tape or die-attach adhesive as described with respective to adhesive element 64. The dies 42", 46" can be pre-taped or an adhesive element 66" can be applied to the surface of either or both dies during fabrication of the package.

The bond pads 48b" of the second die 46" are then electrically connected to the terminal pads 52b" on the support substrate 44", for example, by wire bonding or by TAB binding, resulting in a structure similar to that shown in FIG. 16.

Figure 18:
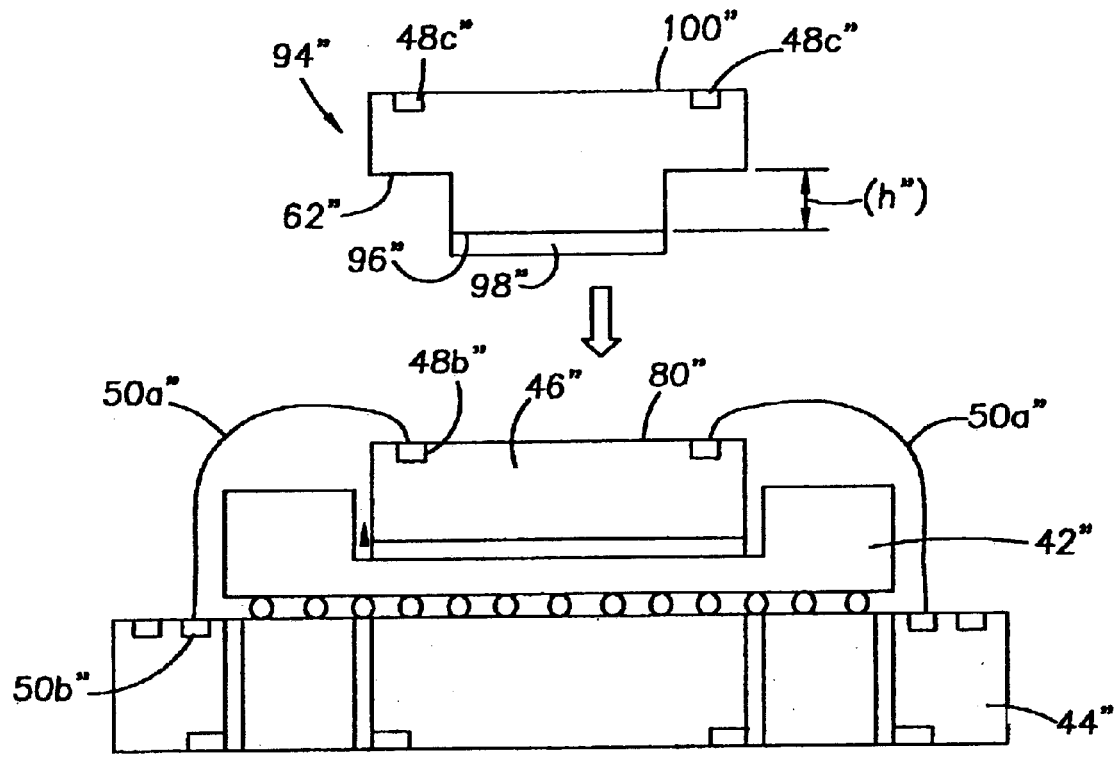
FIGS. 18–19 illustrate sequential processing steps in the fabrication of a portion of the stacked die package of FIG. 17, according to an embodiment of a method of invention, showing the mounting of the third (top) die.
Figure 19:
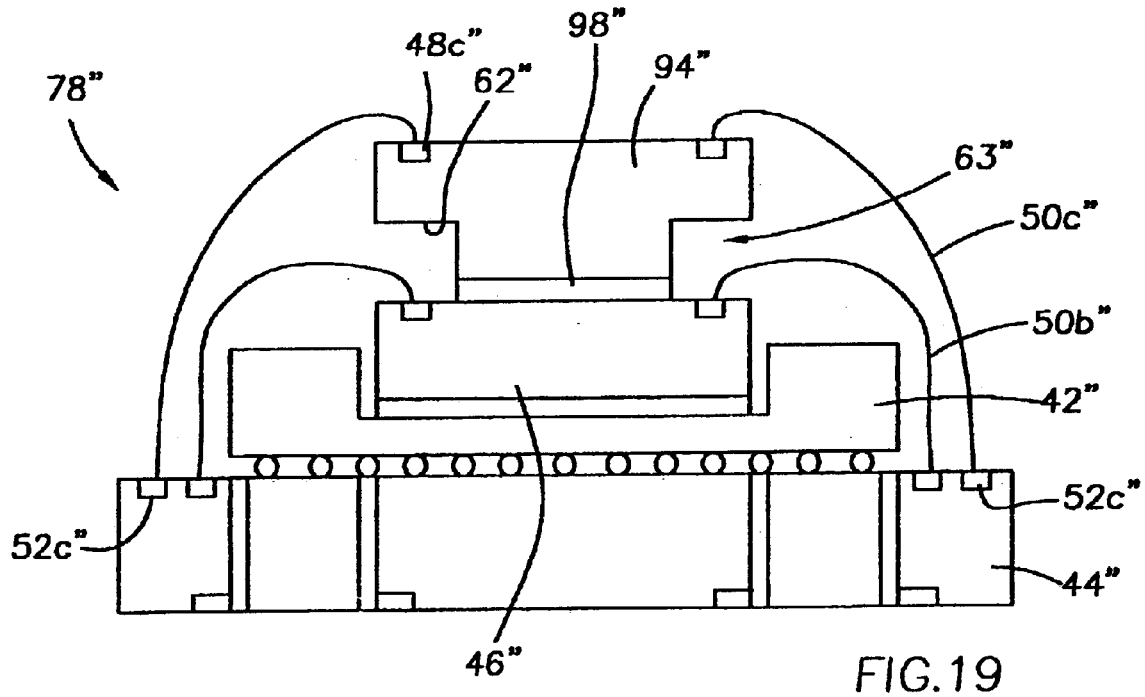

Referring now to FIG. 18, the third (top) die 94" can then be mounted on the second (middle) die 46" similar to the mounting of the second die 46 on the bottom die 42 shown in FIGS. 10–11. The third (top) die 94" is mounted onto the first (active) surface 80" of the second die 46" to form the stacked die assembly 78", as depicted in FIG. 19. The third (top) die 94" comprises a first (active) surface 100" with a plurality of bond pads 48c" along the periphery thereof, and a second surface 96" with recessed edge 62". As shown in FIG. 18, the second surface 96" of the third (top) die 94" is aligned with and facing the first (active) surface 80" of the second (middle) die 46" prior to assembly.

The third (top) die 100" can be attached to the second die 46" by means of an adhesive element 98", for example, a tape or die attach adhesive, as described hereinabove with respect to adhesive element 64. The dies 46", 100" can be provided in a pre-taped form or an adhesive element 98" can be applied to either or both dies during mounting of the third die 94" onto the second die 46". The recessed edge 62" of the third (top) die 94" has a height (h") to provide an opening 63'" with sufficient clearance for the bond wires 50b" extending from the second die 46" to the support substrate 44".

Referring to FIG. 19, the bond pads 48c" of the third (top) die 94" are then electrically connected to the terminal pads 52c" on the support substrate 44", for example, by wire bonding or TAB bonding.

The die assembly 78" can be partially or fully encapsulated resulting in the die package 40" depicted in FIG. 17. External contacts 54" in the form of conductive solder balls (or other suitable conductive material or form) are mounted on the second (bottom) surface 84" of the support substrate 44" to provide electrical connection of the die package 40" to an electrical apparatus (not shown). Thereafter, a multi-die panel can be singulated into individual die packages.

Figure 20:
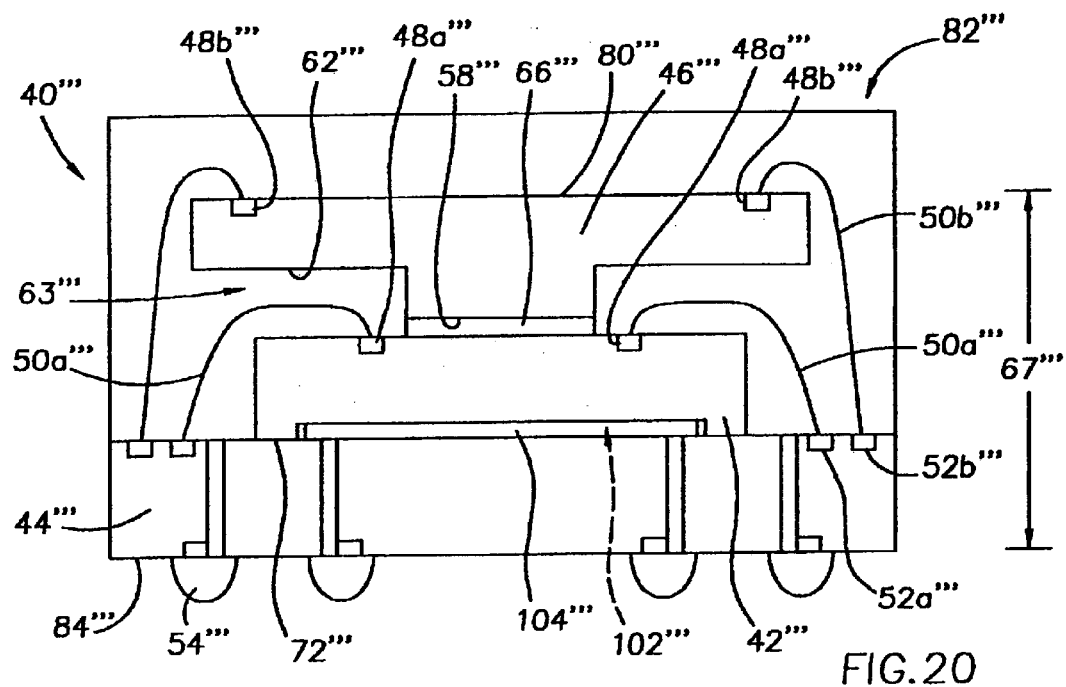
FIG. 20 is a cross-sectional, side elevational view of another embodiment of a stacked die package according to the invention.

Referring to FIG. 20, another embodiment of a multiple chip die assembly package according to the invention is depicted in a cross-sectional, side elevational view. The package 40'" comprises a first (bottom) die 42'" mounted to a support substrate 44'", and a second (top) die 46'" mounted on the bottom die 42'". As illustrated, the second die 46'" is larger in size, i.e., a greater width (w) and/or length (l) than the bottom die (see FIG. 6). Bond pads 48a'", 48b'", on the first and second dies 42'", 46'" are wire bonded 50a'", 50b'" to terminal pads 52a'", 52b'" on the support substrate 44'", which further includes external contacts 54'" to connect the die package 40'" to an electrical apparatus. Similar to the die 46 depicted and described with respect to FIGS. 4–6, a portion of the second (inactive) surface 58'" of the second (top) die 46'" is removed to provide a recessed edge 62'" for sufficient clearance for the bond wires 50a'" mounted on the underlying bottom die 42'". A cavity or recess 102'" is also etched in the second (bottom) surface 72'" of the bottom die 42'", and is sized for receiving an adhesive element 104'" therein to secure the bottom die 42'" to the support substrate 44'". The recess features 62'", 102'" combine to achieve a lower overall package height 67'" for the package 40'" by eliminating the need for a spacer between the top and bottom dies, and mounting the adhesive element 104'" as an insert into the recess 102'" in the bottom die 42'" rather than as a distinct layer between the bottom die 42'" and the substrate 44'". In addition, the recess 102'" contains a die-attach adhesive therein and limits the amount of adhesive (epoxy) bleed onto bond fingers and/or other components on the substrate adjacent to the die edge.

FIGS. 21–24 illustrate an embodiment of a method and process flow for forming the stacked die package of FIG. 20.

Prior to mounting, the recesses 102'", 62'" can be formed in the first (bottom) die 42'" and the second (top) die 46'", respectively.

Figure 21:
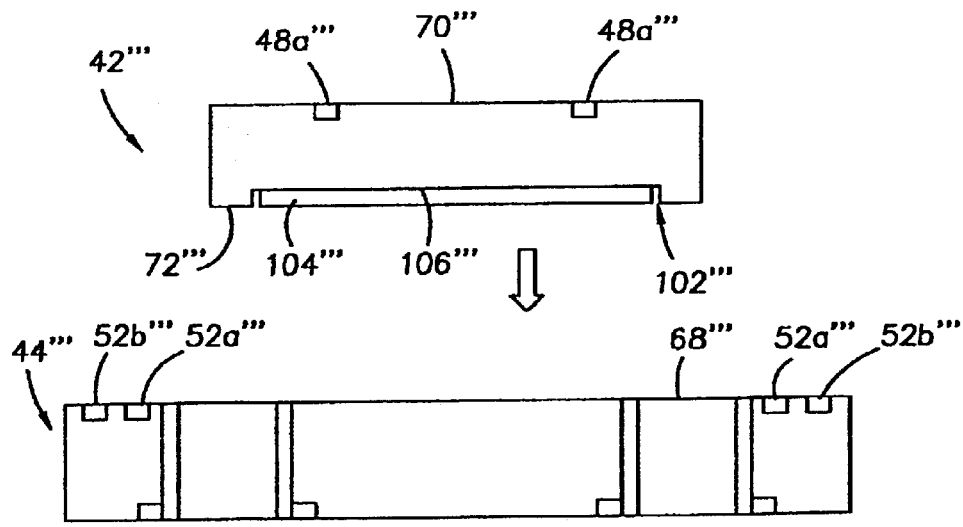
FIGS. 21–24 illustrate sequential processing steps in the fabrication of the stacked die package of FIG. 20, according to an embodiment of a method of invention.
Figure 22:
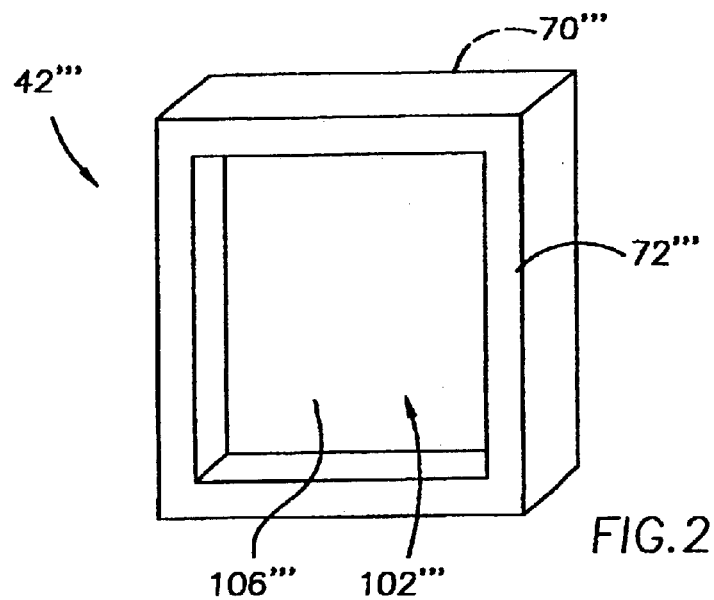

As shown in FIG. 21, and in a bottom perspective view in FIG. 22, a recess 102'" is formed in the second (bottom) surface 72'" of the first (bottom) die 42'". The recess 102'" is sized and configured to receive an adhesive member 104'" therein for attachment of the die 42'" to the substrate 44'". The recess 102'" can be formed in any suitable shape, such as square, rectangular, oval, and circular. The recess 102'" can be formed using known methods in the art, for example, patterning and utilizing a chemical wet etch or dry etch, mechanical drilling or punching, and laser ablation of the second surface 72''' of the die 42'''. The recess 102''' can be formed at the wafer level or the die level (i.e., singulated die).

A recessed edge 62''' along the perimeter 56''' of the second (inactive) surface 58''' of the second (top) die 46''' can be formed as described previously for the second die 46 (package 40) depicted in FIGS. 4–6. A portion of the die 46''' is removed such that, when the second die 46''' is then mounted onto the first die 42''', the recessed edge 62''' provides an opening 63''' for sufficient clearance of the bond wires 50a''' extending from the first die 42''' to the terminal pads 52a''' on the support substrate 44'''.

Referring to FIG. 21, the second (bottom) surface 71''' of the first (bottom) die 42''' is aligned with and facing the first (upper) surface 68''' of the support substrate 44''' prior to assembly.

The first die 42''' is attached to the support substrate 44''' by means of an adhesive element 104'''. The adhesive element 104''' can be applied to the recess surface 106''' of the recess 102''' of the first (bottom) die 42''', and/or onto the first (upper) surface 68''' of the substrate 44''' and aligned with the recess 102''' to be received therein. The adhesive element 104''' can comprise an adhesive gel or tape, as described hereinabove with respect to adhesive element 64 (package 40). The first die 44''' and/or the substrate 44''' can be provided in a pre-taped form, or an adhesive element 104''' can be applied to the surface of either or both the first die 42''' and the substrate 44''' during the attachment step. The first die 42''' is attached to the substrate 44''' such that the terminal pads 52a''', 52b''' on the surface of the substrate are exposed.

Figure 23:
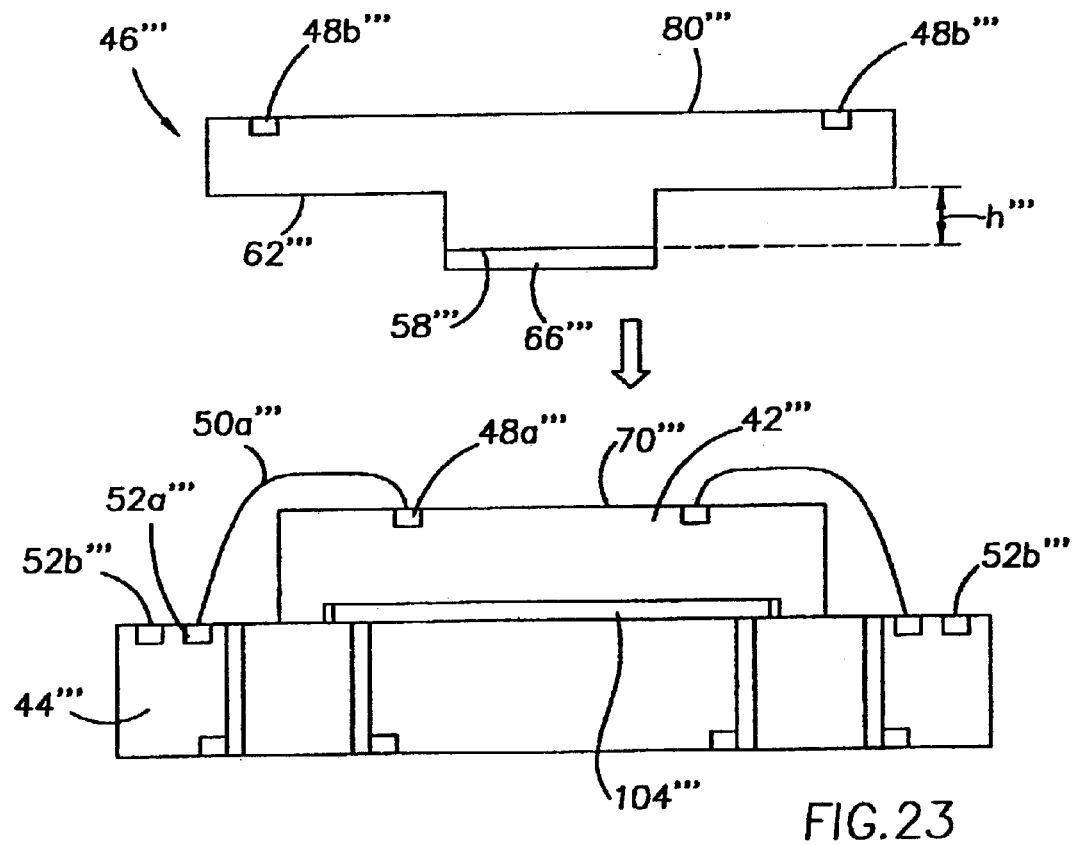
Figure 24:
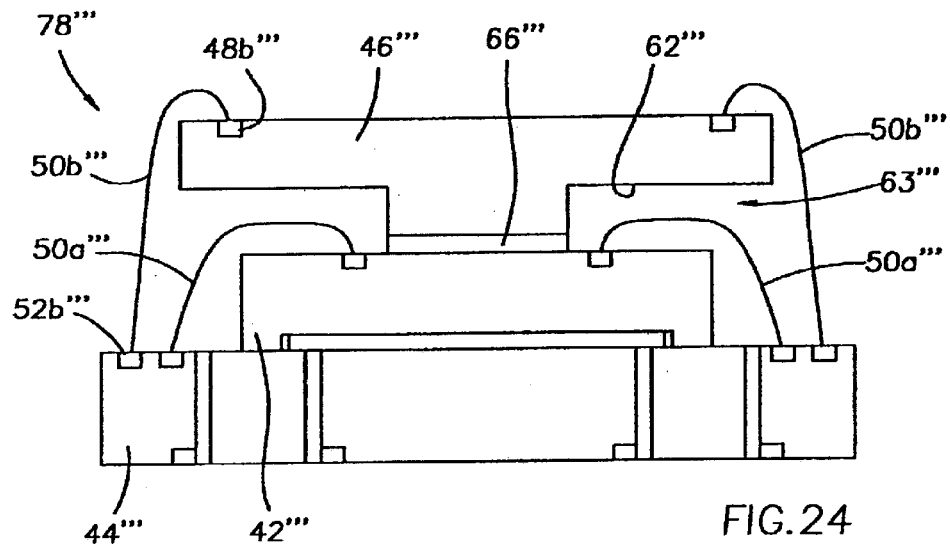

Referring to FIGS. 23–24, the second (top) die 46''' is then mounted onto the first (bottom) die 42''' to form the stacked die assembly 78'''. As shown in FIG. 23, the second surface 58''' of the second (top) die 46''' is aligned with and facing the first (active) surface 70''' of the first (bottom) die 42''' prior to assembly. The second (top) die 46''' can be attached to the first die by means of an adhesive element 66''', for example, with a tape or die attach adhesive, as described with respect to the adhesive element 64 (die package 40). Either or both of the first and second dies 42''', 46''' can be provided in a pre-taped form or the adhesive element 66''' can applied to either or both dies during the mounting step.

As depicted in FIG. 24, the bond pads 48b''' of the second (top) die 46''' can then be electrically connected to the terminal pads 52b''' on the substrate 44'''. The recessed edge 62''' of the second (top) die 46''' has a height (h''') sufficient to provide an opening 63''' for adequate clearance of the bonding wires 50a''' extending from the second die 46''' to the substrate 44'''.

The wire-bonded stacked die assembly 78''' can be partially or fully encapsulated with an encapsulant material 82''' using known techniques in the art to form the encapsulated stacked die package 40''' as depicted in FIG. 20. Thereafter, external contacts 54''' can be mounted on the second (bottom) surface 84''' of the support substrate 44''' for electrical connection of the die package 40''' to an external electrical apparatus (not shown).

Singulation of a multiple die panel or strip can then be performed to provide individual die packages 40'''.

Figure 25:
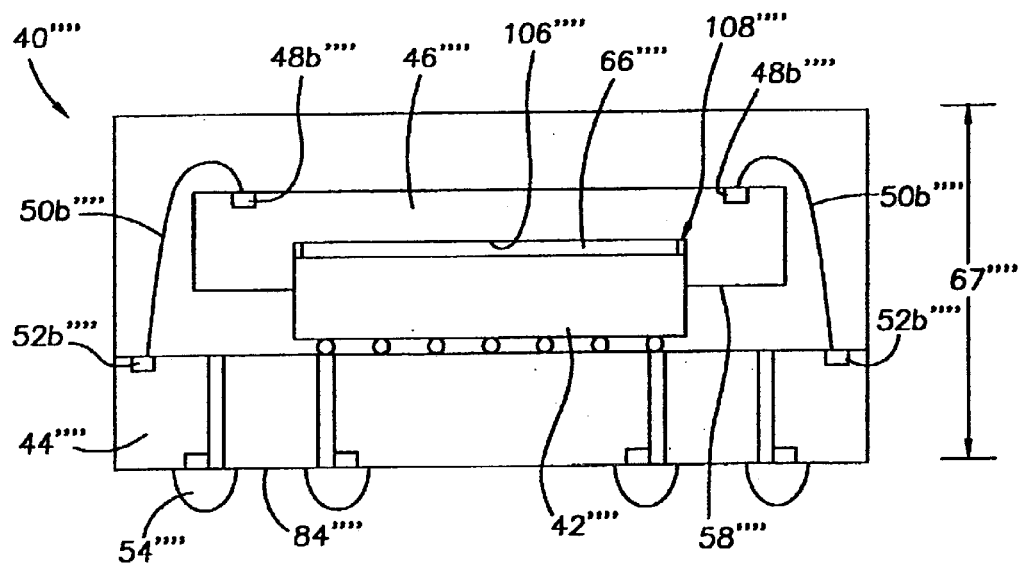
FIG. 25 is a cross-sectional, side elevational view of another embodiment of a stacked die package according to the invention.

Referring to FIG. 25, a further embodiment of a multiple chip die assembly package according to the invention, is depicted in a cross-sectional, side elevational view. The package 40'''' comprises a first (bottom) die 42'''' mounted in a flip chip attachment to a support substrate 44'''', and a larger sized, second (top) die 46'''' mounted on the first (bottom) die 42''''. Bond pads 48b'''' on the second (top) die 46'''' are wire bonded 50b'''' to terminal pads 52b'''' on the support substrate 44''''. External contacts 54'''' are mounted on the second (bottom) surface of the substrate 44'''' for connecting the package 40'''' to an external electrical apparatus (not shown). A portion of the second (bottom) surface 58'''' of the second (top) die 46'''' is removed to provide a recess 108'''' for receiving the bottom die 42'''' therein. The recess feature 108'''' helps achieve a lower overall package height 67'''' for the package 40'''' by nesting the first die 42'''' within the overlying second die 46''''.

FIGS. 26–29 illustrate an embodiment of a method and process flow for forming the stacked die package of FIG. 25.

Figure 26:
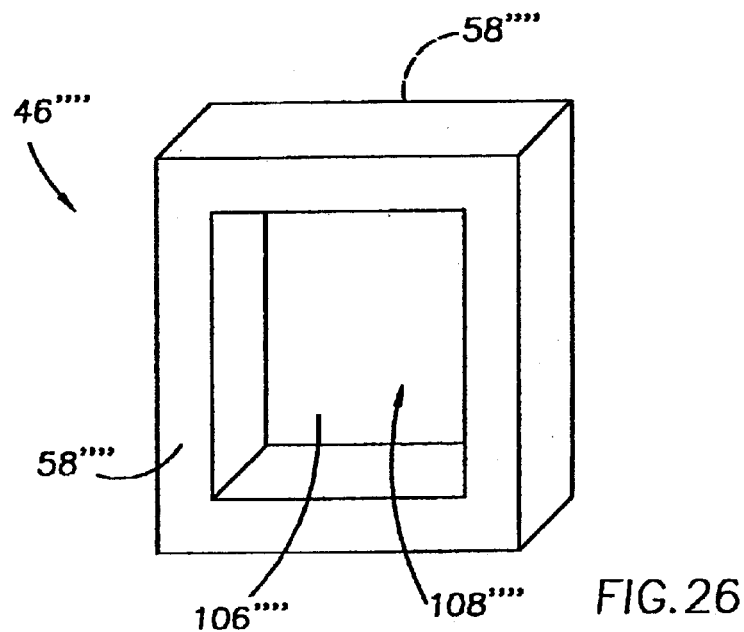
FIGS. 26–29 illustrate sequential processing steps in the fabrication of the stacked die package of FIG. 25, according to an embodiment of a method of invention.

Prior to mounting, the recess 108'''' can be formed in the second (bottom) surface 58'''' of the second (top) die 46'''', as shown in FIG. 25 and in a bottom perspective view in FIG. 26. The recess 108'''' can be formed at the wafer level or the die level. The recess 108'''' is sized and configured to receive the bottom die 42'''' therein, and can be formed in any suitable shape, such as square, rectangular, oval, and circular using known techniques in the art.

Figure 27:
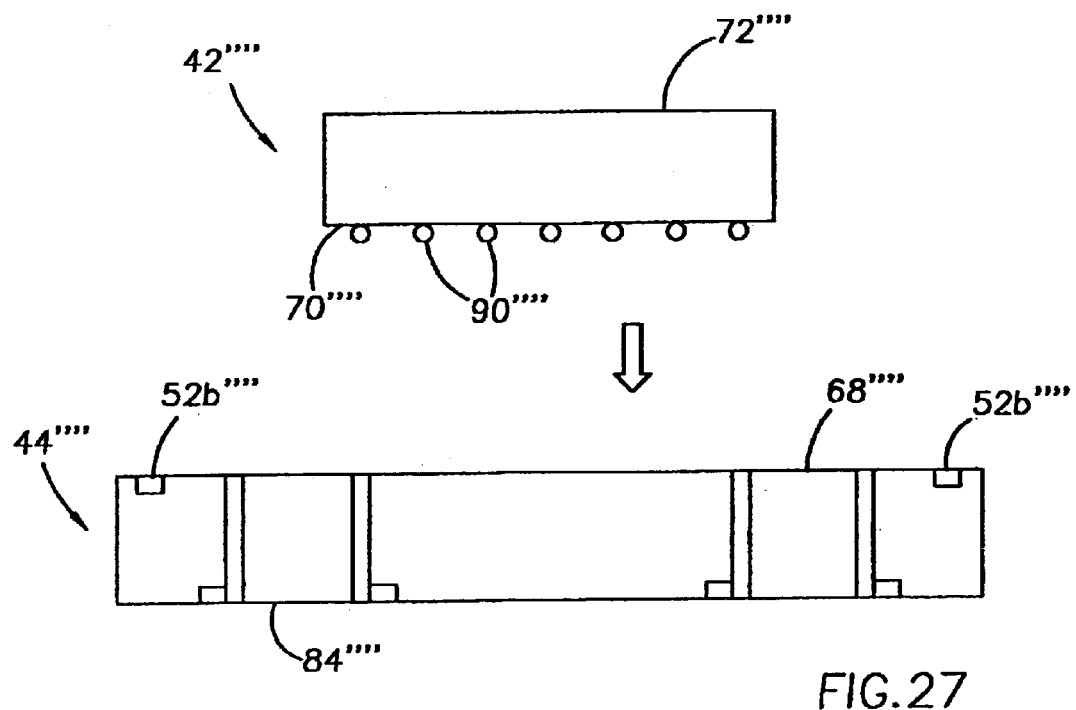

As depicted in FIG. 27, the first (active) surface 70'''' of the first (bottom) die 42'''' is aligned with and facing the first (upper) surface 68'''' of the support substrate 44'''' prior to assembly. The active surface 70'''' of the first die 42'''' includes a plurality of bond pads with conductive bumps 90'''' mounted thereon, which are arranged in a predetermined configuration. The bottom die 42'''' can be mounted on the support substrate 44'''' according to conventional flip chip techniques, resulting in the structure shown in FIG. 28.

Figure 28:
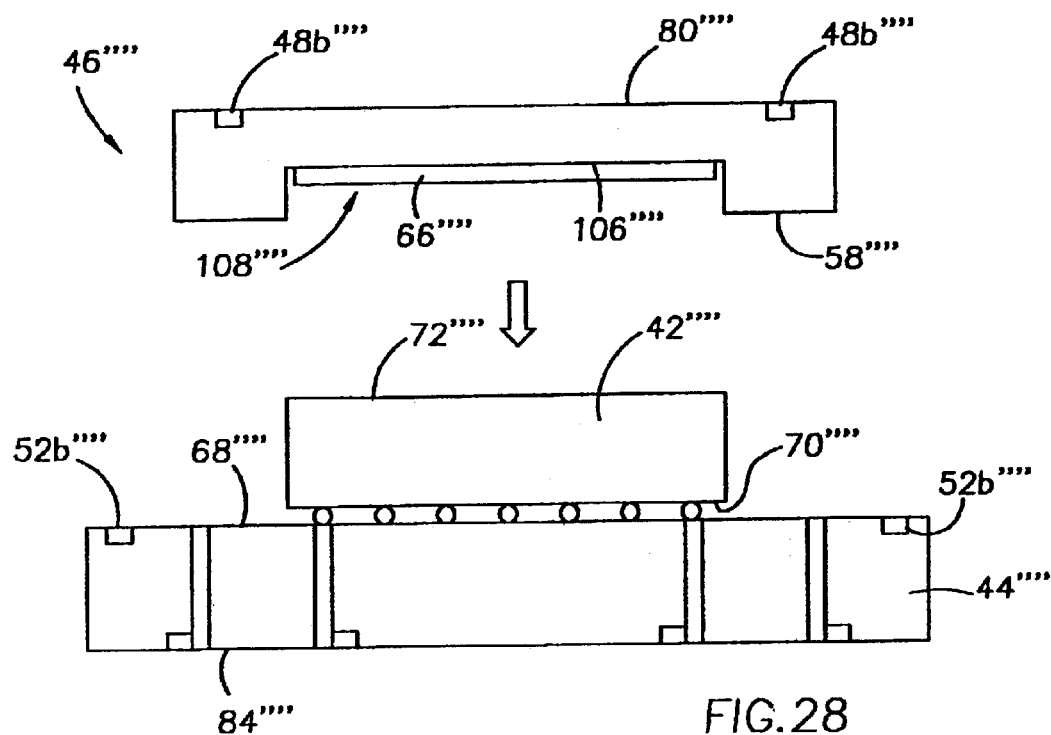

The second (top) die 46'''' is then mounted onto the first (bottom) die 42'''' to form the stacked die assembly 78''''. As shown in FIG. 28, the second surface 58'''' of the second (top) die 46'''' is aligned with and facing the second surface 72'''' of the first (bottom) die 42'''' prior to assembly. The first (bottom) die 42'''' is received at least partially in the recess 108'''' and can be attached to the recess surface 106'''' of the second die 46'''' by means of an adhesive element 66'''' such as a tape or die attach adhesive as described with respect to the adhesive element 64 (die package 40). Either or both of the first and second dies 42'''', 46'''' can be provided in a pre-taped form, or the adhesive element 66'''' can applied to either or both dies during the mounting step.

Figure 29:
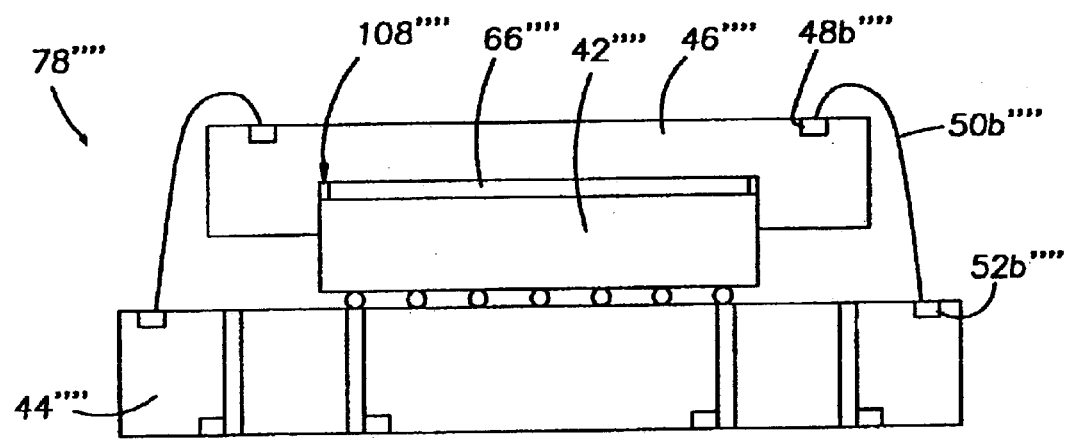

Referring to FIG. 29, the bond pads 48b'''' of the second (top) die 46'''' can then be electrically connected to the terminal pads 52b'''' on the substrate 44''''.

Partial or full encapsulation of the die assembly 78'''' can be performed using known techniques in the art to form the encapsulated package 40'''' shown in FIG. 25. External contacts 54'''' can then be mounted on the second (bottom) surface 84'''' of the substrate 44'''' to facilitate electrical connection of the component die package 40'''' to an external electrical apparatus (not shown).

Individual die packages of a multiple die panel (e.g., as shown with reference to panel 74 in FIG. 8) can be separated by a singulation technique.

COMPARATIVE EXAMPLE 1 AND EXAMPLE 2

Figure 1:
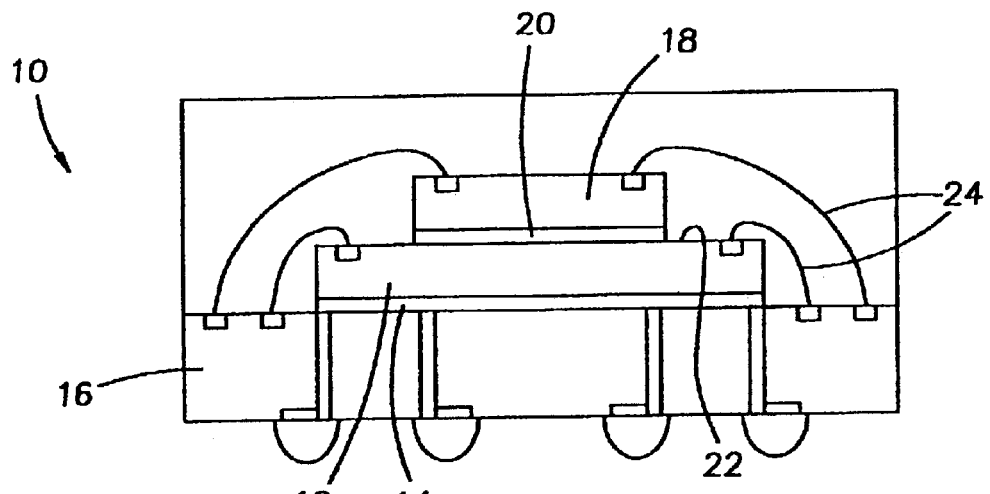
FIGS. 1–3 depict cross-sectional, side elevational views of prior art embodiments of stacked die packages.
Figure 2:
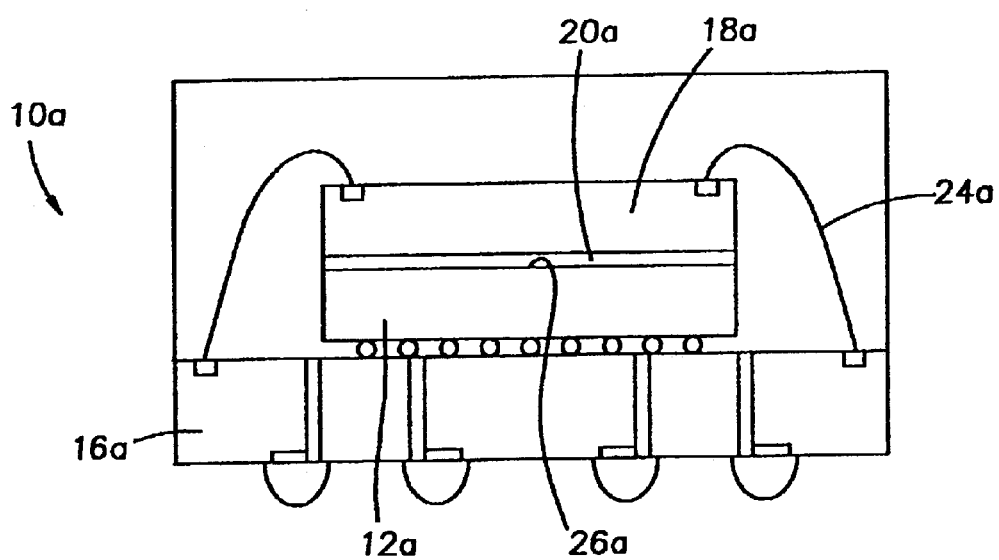

A comparison of the package design shown in FIG. 2 (prior art) with the package design shown in FIG. 12.

|  | FIG. 2 | FIG. 12 |
|---|---|---|
| Bottom die, thickness | 6 mils | 6 mils |
| Second die, thickness | 6 mils | 6 mils |
| Bond line, thickness | 1 mil | 1 mil |
| Slot (recess) depth | — | 4 mils |
| Overall total thickness of the stacked dies | 13 mils | 9 mils |

By utilizing a package design according to the invention, a lower package height can be achieved using thicker dies. In addition, thicker dies can be utilized to help reduce the number of cracked dies that occur during the assembly process.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A stacked die assembly, comprising:
   at least two semiconductor dies situated on a substrate in a stacked arrangement; the substrate comprising a first surface having terminal pads thereon, and a second surface;
   a first die comprising a first surface situated on the first surface of the substrate, and a second surface having a recess formed therein; and
   a second die comprising a first side, and an opposing second side being at least partially situated within the recess of the first die.

2. A stacked die assembly, comprising:
   at least two semiconductor dies situated on a substrate in a stacked arrangement; the substrate comprising a first surface having terminal pads thereon, and a second surface;
   a first die comprising a first surface situated on the first surface of the substrate through a flip chip attachment, and a second surface comprising a recess; and
   a second die comprising a first surface, and a second surface being at least partially situated within the recess of the first die.

3. A stacked die assembly, comprising:
   at least two semiconductor dies on a substrate in a stacked arrangement; the substrate comprising a first surface having terminal pads thereon, and a second surface;
   a first die comprising a first surface situated on the first surface of the substrate through a flip chip attachment, a second surface comprising a recess; and
   a second die comprising a first side having bond pads thereon, and an opposing second side situated on the first die and at least partially situated within the recess of the first die.

4. The die assembly of claim 3, further comprising: bonding elements connecting the bond pads of the second die to the terminal pads on the substrate.

5. The die assembly of claim 4, wherein the bonding elements comprises one of a wire bond and a TAB tape.

6. The die assembly of claim 3, further comprising: an adhesive element situated within the recess between the second die and the first die.

7. The die assembly of claim 3, wherein the adhesive element comprises one of a die attach adhesive, and a tape adhesive.

8. The die assembly of claim 3, being at least partially encapsulated.

9. A stacked die assembly, comprising:
   a plurality of semiconductor dies situated on a substrate in a stacked arrangement; the substrate comprising a first surface having terminal pads thereon, and a second surface;
   a first die comprising a first surface on the first surface of the substrate, and a second surface having a recess formed therein; and
   a second die comprising a first side, and an opposing second side being at least partially situated in the recess of the first die; and
   a third die situated on the second die.

10. A semiconductor die package, comprising the die assembly of claim 1, being at least partially encapsulated.

11. A stacked die assembly, comprising:
    a first die comprising a first surface situated on a substrate and a second surface having a recess formed therein; and
    a second die comprising a first side, and a second side being at least partially situated within the recess of the first die in a stacked arrangement.

12. The die assembly of claim 11, being at least partially encapsulated.

13. The die assembly of claim 11, wherein the substrate comprises a leadframe.

14. The die assembly of claim 11, further comprising: bonding elements connecting bond pads on the second die to terminal pads on the substrate.

15. The die assembly of claim 11, further comprising a third die situated on the second die.

16. The die assembly of claim 15, wherein the third die has at least one of a length or a width greater than the first die.

17. A panel substrate, comprising multiple die assemblies according claim 11.

18. An apparatus, comprising:
    an electrical apparatus; and
    the die assembly of claim 11 in electrical communication with the electrical apparatus.

19. The apparatus of claim 18, wherein the electrical apparatus is selected from the group consisting of a PCB, motherboard, program logic controller, and a testing apparatus.

20. A stacked die assembly, comprising:
    a first die comprising first and second surfaces, the first surface situated on a substrate, and the second surface having a recess formed therein; the substrate comprising terminal pads thereon;
    a second die comprising a first surface having bond pads thereon, and a second surface being at least partially situated within the recess of the first die; and
    a third die situated on the second die and comprising a first surface, an opposing second surface, and a perimeter; the first surface having bond pads thereon, the second surface comprising a recessed edge portion along the perimeter; wherein the recessed edge portion of the third die provides sufficient clearance for bonding elements extending from the bond pads of the second die to the terminal pads on the substrate.

21. The assembly of claim 20, further comprising bonding elements connecting the bond pads of the second die to the terminal pads on the substrate.

22. The die assembly of claim 20, being at least partially encapsulated.

23. A panel substrate, comprising multiple die assemblies according to claim 20.

24. An apparatus, comprising:
an electrical apparatus; and
the die assembly of claim 20 in electrical communication with the electrical apparatus.

25. A stacked die assembly, comprising:
a first die situated on a substrate and comprising first and second surfaces, each surface having a recess formed therein; and
a second die situated on the substrate and at least partially within the recess of the first surface.

26. A stacked die assembly, comprising:
a first die situated on a substrate and comprising first and second surfaces, each surface having a recess formed therein, and the first surface being attached to the substrate by an adhesive element situated within said recess of the first surface; and
a second die at least partially situated within the recess of the second surface.

27. The die assembly of claim 26, being at least partially encapsulated.

28. A panel substrate, comprising multiple die assemblies according to claim 26.

29. An apparatus, comprising:
an electrical apparatus; and
the die assembly of claim 26, in electrical communication with the electrical apparatus.

30. A stacked die assembly, comprising:
a first die situated on a substrate and comprising first and second surfaces, each surface having a recess formed therein, the first surface situated on the substrate;
a second die situated on the substrate and at least partially within the recess of the first surface of the first die; and
a third die at least partially situated within the recess of the second surface of the first die.

31. The die assembly of claim 30, being at least partially encapsulated.

32. A panel substrate, comprising multiple die assemblies according to claim 30.

33. An apparatus, comprising:
an electrical apparatus; and
the die assembly of claim 30 in electrical communication with the electrical apparatus.

34. A stacked die assembly, comprising:
a first die situated on a substrate through a flip chip attachment and comprising a surface having a recess formed therein; and
a second die comprising a first surface, and a second surface being at least partially situated within the recess of the first die in a stacked arrangement.

35. A stacked die assembly, comprising:
a first die comprising first and second surfaces, the first surface situated on a substrate through a flip chip attachment, and the second surface having a recess formed therein; the substrate comprising terminal pads thereon; and a second die comprising a first surface, and a second being at least partially situated within the recess of the first die and comprising bond pads thereon and bonding elements connecting the bond pads of the second die to the terminal pads on the substrate.

36. The die assembly of claim 35, wherein the bonding elements comprise one of a wire bond or a TAB tape.

37. A stacked die assembly, comprising:
a first die comprising first and second surfaces, the first surface situated on a substrate, and the second surface having a recess formed therein; the substrate comprising terminal pads thereon;
a second die comprising first and second surfaces, the second surface at least partially situated within the recess of the first die and comprising bond pads disposed thereon; and
means for mounting the first die on the substrate;
means for mounting the second die in the recess of the first die; and
means for connecting the bond pads of the second die to the terminal pads on the substrate.

38. The assembly of claim 37, wherein the mounting means of the first die comprises a flip chip attachment.

39. The assembly of claim 37, further comprising means for connecting the assembly to an external electrical apparatus.

40. A stacked die assembly, comprising:
a first die comprising first and second surfaces, the first surface situated on a substrate, and the second surface having a recess formed therein; the substrate comprising terminal pads thereon;
a second die comprising first and second surface, the second surface at least partially situated within the recess of the first die, and the first surface comprising bond pads thereon; and
a third die situated on the second die and comprising a perimeter, a the first surface having bond pads thereon, and a second surface comprising a recessed edge portion along the perimeter, the second surface of the third die situated on the first surface of the second die;
means for mounting the first die on the substrate;
means for mounting the second die in the recess of the first die;
means for mounting the third die on the second die; and
means for connecting the bond pads of the second and third dies to the terminal pads on the substrate;
whereby the recessed edge portion of the third die provides sufficient clearance for the connecting means extending from the bond pads of the second die to the substrate.

41. A stacked die assembly, comprising:
at least two semiconductor dies situated on a substrate in a stacked arrangement; the substrate comprising a first surface having terminal pads thereon, and a second surface;
a first die comprising a first surface situated on the first surface of the substrate, and a second surface having a recess formed therein;
a second die comprising a first side having bond pads thereon, and an opposing second side at least partially situated within the recess of the first die;
means for mounting the first die on the substrate;
means for mounting the second die in the recess of the first die; and means for connecting the bond pads of the second die to the terminal pads on the substrate.

42. The assembly of claim 41, wherein the mounting means of the first die comprises a flip chip attachment.

43. The assembly of claim 41, further comprising means for connecting the assembly to an external electrical apparatus.

44. The assembly of claim 41, being at least partially encapsulated to form a die package.

45. An apparatus, comprising:
an electrical apparatus; and
the die package of claim 44, in electrical communication with the electrical apparatus.

46. A stacked die assembly, comprising:
a first die comprising first and second surfaces, the first surface situated on a substrate and the second surface comprising a recess; and
a second die comprising first and second surfaces, the second surface at least partially situated in said recess of the first die.

47. A stacked die assembly, comprising:
a first die comprising first and second surfaces, the first surface situated on a substrate and comprising a recess, and the second surface comprising a recess; and
a second die at least partially disposed in the recess of the second surface of the first die.

48. The assembly of claim 47, wherein an adhesive element is situated within the recess of the first surface of the first die to attach the first die to the substrate.

49. The assembly of claim 47, wherein a third die is situated on the substrate and within the recess of the first surface of the first die.

50. The assembly of claim 49, wherein the third die is attached to the substrate through a flip chip attachment.

51. A stacked die assembly, comprising:
a first die comprising an active surface situated on a substrate and an inactive surface comprising a recess; and
a second die at least partially situated in said recess of the first die.

52. The assembly of claim 51, wherein the first die is attached to the substrate through a flip chip attachment.

53. The assembly of claim 51, being at least partially encapsulated to form a die package.

54. An apparatus, comprising:
an electrical apparatus; and
the die package of claim 53 in electrical communication with the electrical apparatus.

55. A stacked die assembly, comprising:
a first die comprising first and second surfaces, the first surface of the first die situated on a substrate and comprising a recess with an adhesive element situated therein to attach the first die to the substrate such that the adhesive layer does not contribute to an overall height of the die assembly; and
a second die situated on the second surface of the first die.

56. The assembly of claim 55, wherein the second surface of the first die comprises a recess, and the second die is at least partially situated in said recess of the second surface of the first die.

57. The assembly of claim 55, being at least partially encapsulated to form a die package.

58. An apparatus, comprising:
an electrical apparatus; and
the die package of claim 57 in electrical communication with the electrical apparatus.

59. A stacked die assembly, comprising:
a first die having a first surface situated on a substrate and a second surface having a recess; and
a second die comprising first and second surfaces, the second surface situated within the recess of the first die.

60. A stacked die assembly, comprising:
a first die having a first surface situated on a substrate and a second surface having a recess;
a second die comprising first and second surfaces, the second surface situated within the recess of the first die; and
a third die situated on the second die.

61. A stacked die assembly, comprising:
a first die having a first surface situated on a substrate and a second surface having a recess;
a second die comprising first and second surfaces, the second surface situated within the recess of the first die; and
a third die situated on the first surface of the second die and having a perimeter and a recessed edge portion on a surface about the perimeter such that the recessed edge portion provides sufficient clearance for a connection of a bonding element to bond pads of the second die and terminal pads on the substrate.

62. A stacked die assembly, comprising:
a first die situated on a substrate and comprising first and second surfaces, the first surface having a second die situated thereon and the second surface having a recess formed therein, the first die being attached to the substrate by an adhesive element situated within said recess such that the adhesive element does not contribute to an overall height of the die assembly.

63. The die assembly of claim 62, further comprising a third die situated on the second die.

64. The die assembly of claim 63, wherein the third die comprises a perimeter and a recessed edge portion on a surface about the perimeter such that the recessed edge portion provides sufficient clearance for a connection of a bonding element to bond pads of the second die and terminal pads on the substrate.

65. The die assembly of claim 62, further comprising:
bonding elements connecting bond pads on the first die to terminal pads on the substrate.

66. The die assembly of claim 62, being at least partially encapsulated.

67. The die assembly of claim 62, wherein the substrate comprises a leadframe.

68. A panel substrate, comprising multiple die assemblies according to claim 62.

69. An apparatus, comprising:
an electrical apparatus; and
the die assembly of claim 62 in electrical communication with the electrical apparatus.

70. The apparatus of claim 69, wherein the electrical apparatus is selected from the group consisting of a PCB, motherboard, program logic controller, and a testing apparatus.

* * * * *

UNITED STATES PATENT AND TRADEMARK OFFICE
CERTIFICATE OF CORRECTION

| | | |
|---|---|---|
| PATENT NO. | : 7,344,969 B2 | Page 1 of 1 |
| APPLICATION NO. | : 10/424470 | |
| DATED | : March 18, 2008 | |
| INVENTOR(S) | : Tan et al. | |

It is certified that error appears in the above-identified patent and that said Letters Patent is hereby corrected as shown below:

In column 14, line 14, in Claim 9, before "on" insert -- situated --.

In column 14, line 44, in Claim 17, before "claim" insert -- to --.

In column 15, line 36, in Claim 29, after "26" delete ",".

In column 16, line 1, in Claim 35, before "being" insert -- surface --.

In column 16, lines 15-16, in Claim 37, after "pads" delete "disposed".

In column 16, line 33, in Claim 40, delete "surface," and insert -- surfaces, --, therefor.

In column 16, line 38, in Claim 40, after "a" delete "the".

In column 17, line 13, in Claim 45, after "44" delete ",".

In column 17, line 27, in Claim 47, delete "disposed" and insert -- situated --, therefor.

Signed and Sealed this

Seventeenth Day of June, 2008

JON W. DUDAS
*Director of the United States Patent and Trademark Office*